US012581690B2

(12) United States Patent
Xiao et al.

(10) Patent No.: US 12,581,690 B2
(45) Date of Patent: Mar. 17, 2026

(54) METHOD OF FORMING SEMICONDUCTOR DEVICE WITH IMPLANTED NANOSHEETS

(71) Applicant: TAIWAN SEMICONDUCTOR MANUFACTURING COMPANY, LTD., Hsinchu (TW)

(72) Inventors: Zhi-Ren Xiao, Hsinchu County (TW); Nuo Xu, San Jose, CA (US); Zhiqiang Wu, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 889 days.

(21) Appl. No.: 17/842,060

(22) Filed: Jun. 16, 2022

(65) Prior Publication Data
US 2023/0411480 A1     Dec. 21, 2023

(51) Int. Cl.
| | |
|---|---|
| *H10D 30/67* | (2025.01) |
| *H01L 21/265* | (2006.01) |
| *H10D 30/01* | (2025.01) |
| *H10D 30/43* | (2025.01) |
| *H10D 30/69* | (2025.01) |
| *H10D 62/10* | (2025.01) |
| *H10D 62/17* | (2025.01) |
| *H10D 62/53* | (2025.01) |
| *H10D 62/60* | (2025.01) |
| *H10D 64/01* | (2025.01) |
| *B82Y 10/00* | (2011.01) |
| *H10D 62/822* | (2025.01) |

(52) U.S. Cl.
CPC ... *H10D 30/6735* (2025.01); *H01L 21/26506* (2013.01); *H01L 21/26513* (2013.01); *H10D 30/014* (2025.01); *H10D 30/43* (2025.01); *H10D 30/6757* (2025.01); *H10D 30/751* (2025.01); *H10D 30/797* (2025.01); *H10D 62/118* (2025.01); *H10D 62/121* (2025.01); *H10D 62/299* (2025.01); *H10D 62/53* (2025.01); *H10D 62/60* (2025.01); *H10D 64/017* (2025.01); *B82Y 10/00* (2013.01); *H10D 62/822* (2025.01); *H10D 64/021* (2025.01)

(58) Field of Classification Search
CPC .......................... H10D 30/751; H10D 30/6735
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Christine S. Kim
*Assistant Examiner* — Andrew Victor Prostor
(74) *Attorney, Agent, or Firm* — Birch, Stewart, Kolasch & Birch, LLP

(57) ABSTRACT
A method of forming a semiconductor device includes forming a fin on a substrate, the fin comprising alternately stacked first semiconductor layers and second semiconductor layers, removing the first semiconductor layers to form a plurality of spaces each between adjacent two of the second semiconductor layers, implanting oxygen into the second semiconductor layers, and forming a gate structure wrapping around the second semiconductor layers.

20 Claims, 30 Drawing Sheets

(56)        References Cited

U.S. PATENT DOCUMENTS

| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 * | 3/2017 | Ching | H01L 21/283 |
| 2020/0066872 | A1 * | 2/2020 | Lin | H10D 62/822 |
| 2022/0231124 | A1 * | 7/2022 | Lee | H01L 21/02631 |

* cited by examiner

100

106

110/110C
108/108C
110/110B
108/108B
110/110B
108/108A

102

100

114

112

118

102

204

120
110
108

100

114

104

102

120

108

100

110m
110
142

118

102

104

100

138

140

134

130
228
126

136
110
110m
110
108
134
142

104

102

100

110m
110
142
146
118
102

104

100

138
1000
140
134
126 130 228
136
110
110m
110
108
134
142

104
102

METHOD OF FORMING SEMICONDUCTOR DEVICE WITH IMPLANTED NANOSHEETS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed. GaInAs, GaInP, and/or GaInAsP; or combinations thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
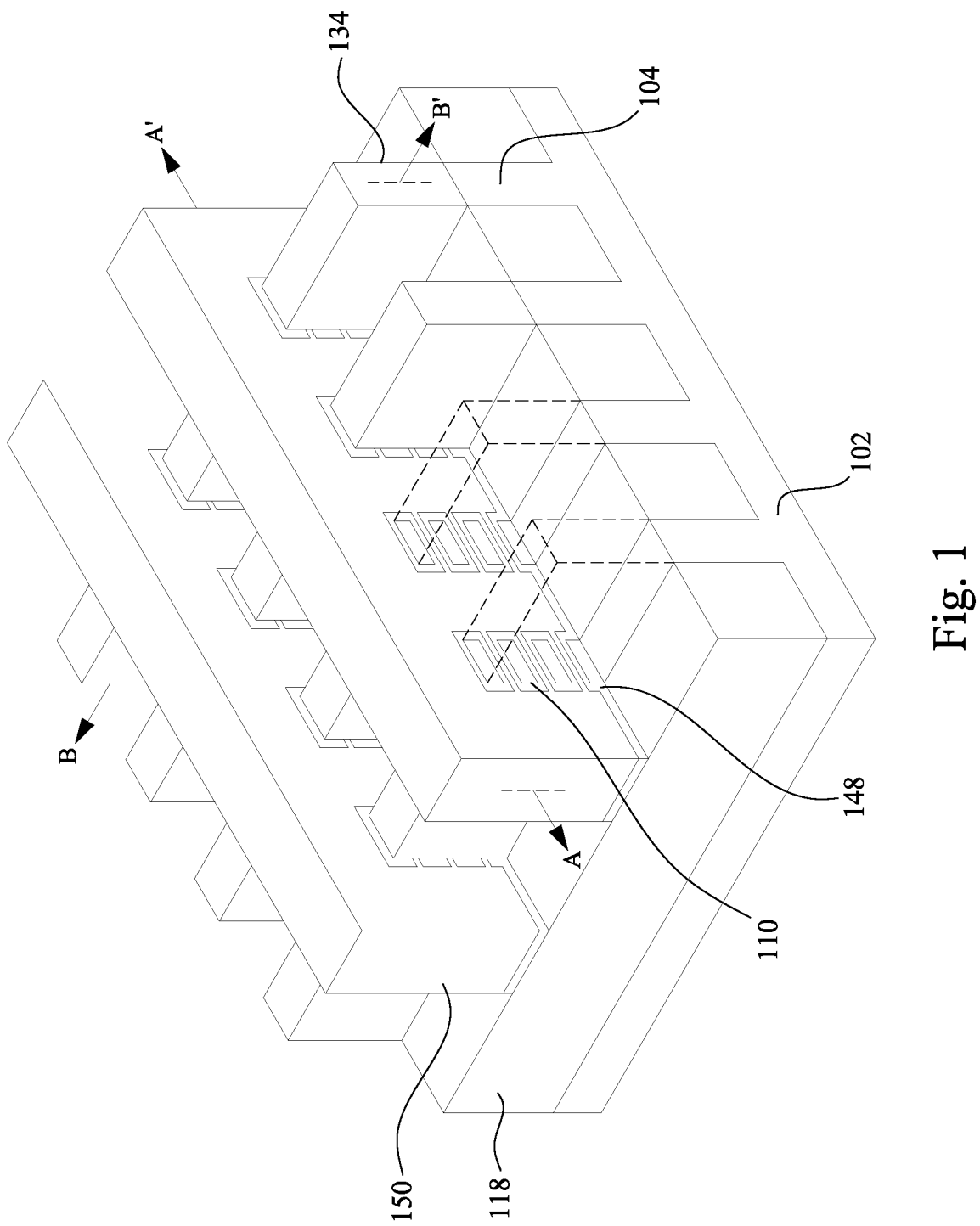
FIG. 1 illustrates an example of a nanosheet field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar process using a same or similar material(s).

Due to Dennard scaling is almost saturating in advanced technology nodes, highly demand for silicon-based complementary metal oxide semiconductor (CMOS) transistors boosters, particularly for high performance (HP) applications. Strained silicon technology can enhance transistor's drive current by increasing carrier mobility in channel without much degradation on leakage, and hence serves as a major knob in advanced technology nodes. For example, a stressor formed in at least one of source/drain regions of the device is configured to enhance charge carrier mobility in the at least one source/drain regions.

However, due to scaling down of the semiconductor device, most stressors suffer from reduced volume and hence cannot generate sufficient stress to impact the carrier mobility. Besides, for n-type channels, stress enhancement is mainly determined by sub-band re-occupation effect, which diminishes at high gate bias, high doping concentration and in thin channels.

The present disclosure provides a nanosheet field-effect transistor (NSFET) device having channel regions implanted with oxygen atoms. This configuration offers reduction of the effective electron mass in silicon channel regions. Due to the reduced electron effective mass, increased carrier mobility and decreased source/drain resistance can be achieved, resulting in enhanced drive current. The various aspects of the present disclosure will be discussed below in greater detail with reference to FIGS. 1-29.

FIG. 1 illustrates an example of a nanosheet field-effect transistor (NSFET) device in a three-dimensional view, in accordance with some embodiments. The NSFET device comprises semiconductor fins 104 (also referred to as fins) protruding above a substrate 102. A gate electrode (e.g., a metal gate) 150 is disposed over the fins 104, and source/drain regions 134 are formed on opposing sides of the gate electrode 150. A plurality of nanosheets 110 are formed over the fins 104 and between source/drain regions 134. Isolation regions 118 are formed on opposing sides of the fins 104. A gate dielectric layer 148 is formed around the nanosheets 110. Gate electrodes 150 are over and around the gate dielectric layer 148.

FIG. 1 further illustrates reference cross-sections that are used in later figures. Cross-section A-A is along a longitudinal axis of a gate electrode and in a direction, for example, perpendicular to the direction of current flow between the source/drain regions of an NSFET device. Cross-section B-B is perpendicular to cross-section A-A and is along a longitudinal axis of a fin and in a direction of, for example, a current flow between the source/drain regions of the NSFET device. Subsequent figures refer to these reference cross-sections for clarity. FIGS. 2, 3A-3B, 4A-4B, 5A-5B, 6, 7, 8, 9A-9B, 10A-10B, 11A-11B, 12A-12B, 13A-13B and 14 are cross-sectional views of a nanosheet field-effect transistor (NSFET) device 100 at various stages of manufacturing, in accordance with an embodiment.

Figure 2:
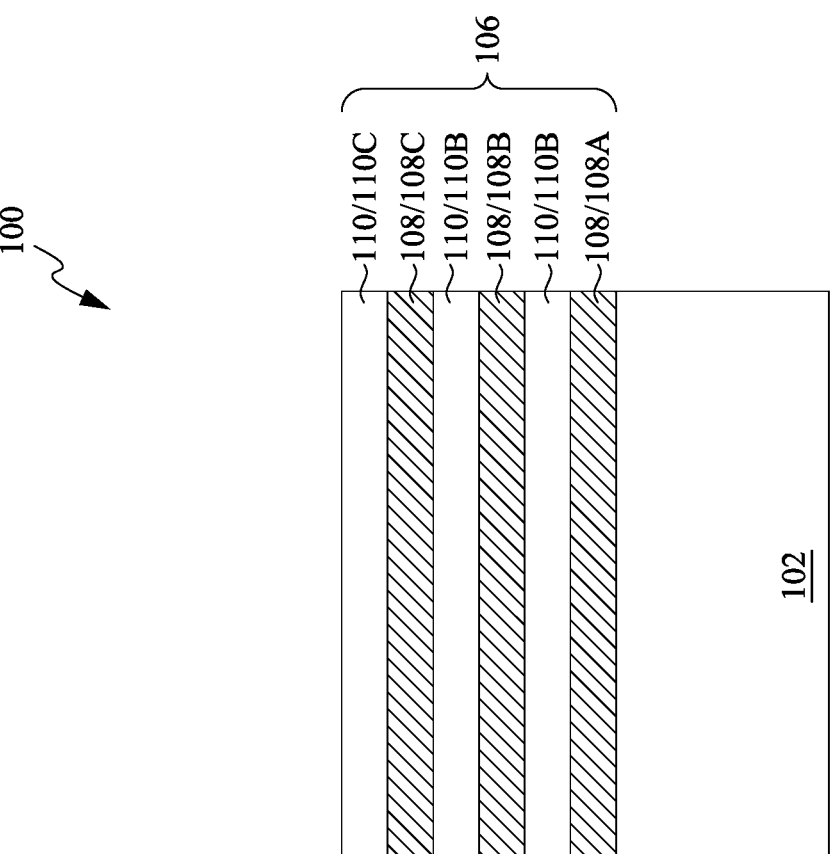
FIGS. 2, 3A-3B, 4A-4B, 5A-5B, 6, 7, 8, 9A-9B, 10A-10B, 11A-11B, 12A-12B, 13A-13B and 14 are cross-sectional views of a nanosheet field-effect transistor device at various stages of manufacturing, in accordance with an embodiment.

In FIG. 2, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 102 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 106 is formed on the substrate 102. The multi-layer stack 106 includes alternating layers of a semiconductor material 108 and a silicon material 110. In FIG. 2, layers formed by the semiconductor material 108 are labeled as 108A, 108B and 108C, and layers formed by the silicon material 110 are labeled as 110A, 110B, and 110C. The number of layers formed by the semiconductor material and the silicon 108 and 110 illustrated in FIG. 2 are merely non-limiting examples. Other numbers of layers are also possible and are fully intended to be included within the scope of the present disclosure.

In some embodiments, the semiconductor material 108 is an epitaxial material suitable for forming channel regions of, e.g., p-type FETs, such as silicon germanium ($Si_xGe_{1-x}$, where x can be in the range of 0 to 1). The silicon material 110 is an epitaxial material suitable for forming channel regions of, e.g., n-type FETs. The multi-layer stacks 106 (may also be referred to as an epitaxial material stack) will be patterned to form channel regions of an NSFET in subsequent processing. In particular, the multi-layer stacks 106 will be patterned to form horizontal nanosheets, with the channel regions of the resulting NSFET including multiple horizontal nanosheets.

The multi-layer stack 106 may be formed by an epitaxial growth process, which may be performed in a growth chamber. During the epitaxial growth process, the growth chamber is cyclically exposed to a first set of precursors for selectively growing the semiconductor material 108, and then exposed to a second set of precursors for selectively growing the silicon material 110, in some embodiments. The first set of precursors includes precursors for the semiconductor material (e.g., silicon germanium), and the second set of precursors includes precursors for the silicon material. In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the semiconductor material 108; and (2) disabling the flow of the germanium precursor to the growth chamber when growing the silicon material 110. The cyclical exposure may be repeated until a target quantity of layers is formed.

FIGS. 2, 3A-3B, 4A-4B, 5A-5B, 6, 7, 8, 9A-9B, 10A-10B, 11A-11B, 12A-12B, 13A-13B and 14 are cross-sectional views of the NSFET device 100 at subsequent stages of manufacturing, in accordance with an embodiment. FIGS. 3A, 4A, 5A, 6, 7, 8, 9A, 10A, 11A, 12A, 13A and 14 are cross-sectional views along cross-section B-B in FIG. 1.

FIGS. 3B, 4B, 5B, 9B, 10B, 11B, 12B, 13B are cross-sectional views along cross-section A-A in FIG. 1. Although one fin and one gate structure are illustrated in the figures as a non-limiting example, it should be appreciated that other numbers of fins and other numbers of gate structures may also be formed.

Figure 3B:
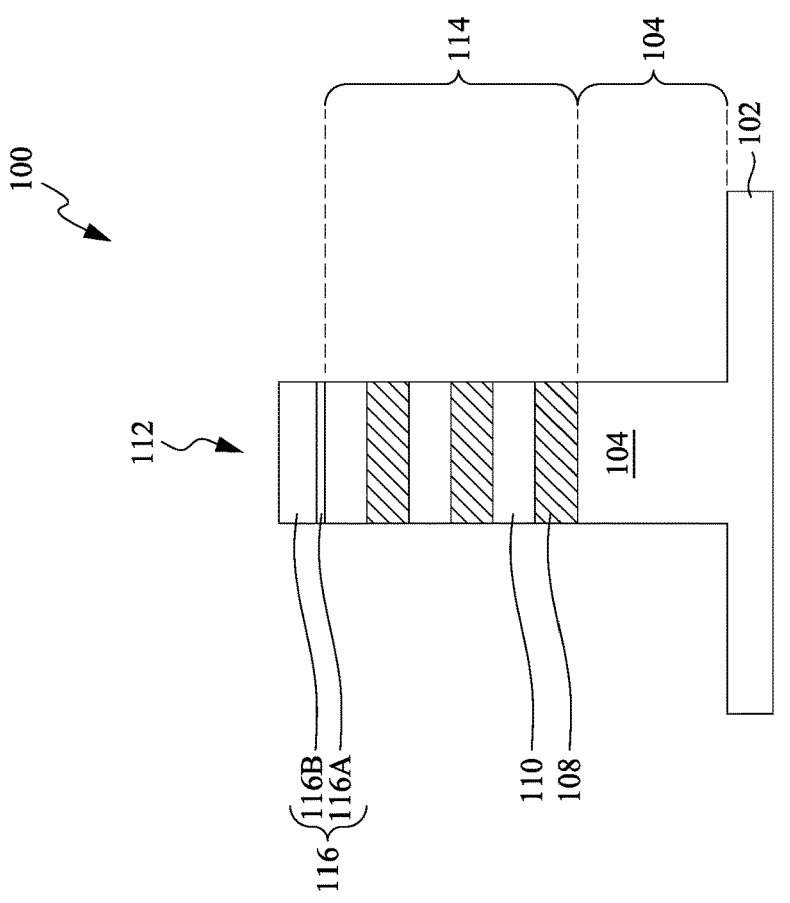
Figure 3A:
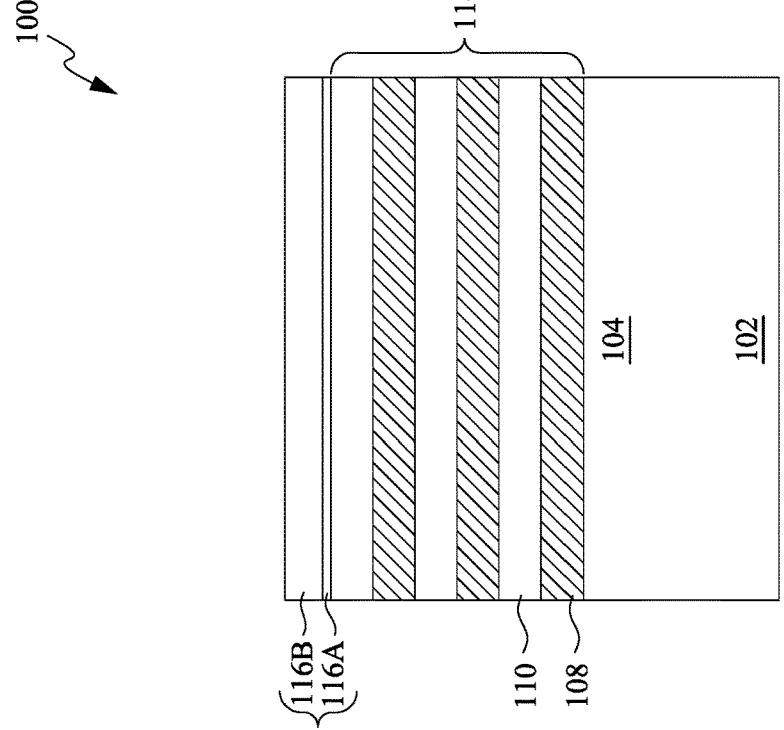

In FIGS. 3A and 3B, a fin structure 112 are formed protruding above the substrate 102. The fin structure 112 includes a semiconductor fin 104 and a nanostructure 114 overlying the semiconductor fin 104. The nanostructure 114 and the semiconductor fin 104 may be formed by etching trenches in the multi-layer stack 106 and the substrate 102, respectively.

The fin structure 112 may be patterned by any suitable method. For example, the fin structure 112 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 112.

In some embodiments, the remaining spacers are used to pattern a mask 116, which is then used to pattern the fin structure 112. The mask 116 may be a single layer mask, or may be a multilayer mask such as a multilayer mask that includes a first mask layer 116A and a second mask layer 116B. The first mask layer 116A and second mask layer 116B may each be formed from a dielectric material such as silicon oxide, silicon nitride, a combination thereof, or the like, and may be deposited or thermally grown according to suitable techniques. The first mask layer 116A and second mask layer 116B are different materials having a high etching selectivity. For example, the first mask layer 116A may be silicon oxide, and the second mask layer 116B may be silicon nitride. The mask 116 may be formed by patterning the first mask layer 116A and the second mask layer 116B using any acceptable etching process. The mask 116 may then be used as an etching mask to etch the substrate 102 and the multi-layer stack 106. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 106 form the nanostructure 114, and the patterned substrate 102 form the semiconductor fin 104, as illustrated in FIGS. 3A and 3B. Therefore, in the illustrated embodiment, the nanostructure 114 also includes alternating layers of the semiconductor material 108 and the silicon material 110, and the semiconductor fin 104 is formed of a same material (e.g., silicon) as the substrate 102.

Figure 4B:
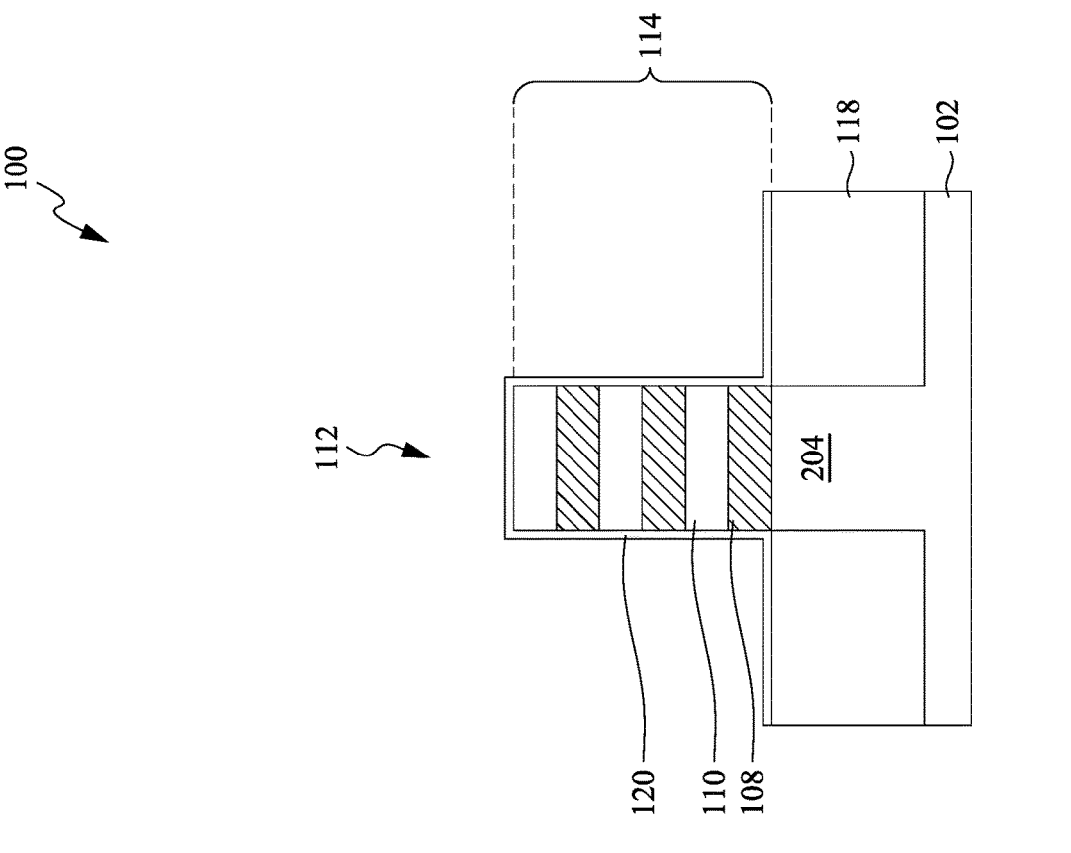
Figure 4A:
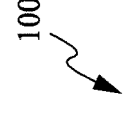
Figure 4A:
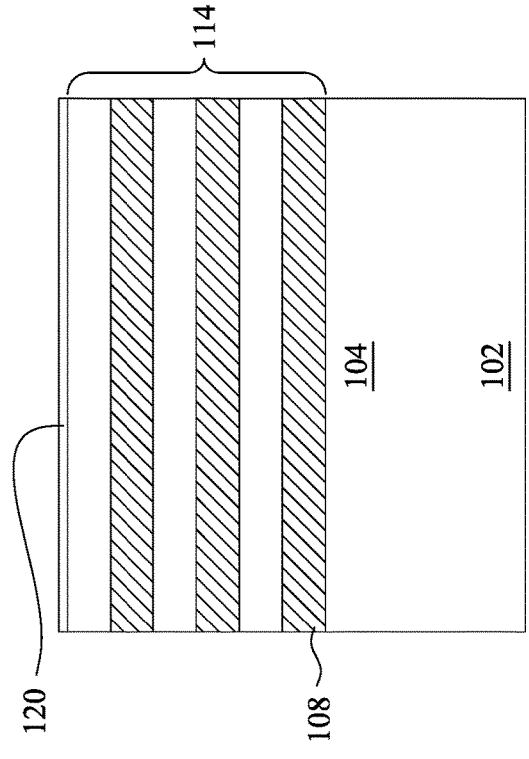

Next, in FIGS. 4A and 4B, Shallow Trench Isolation (STI) regions 118 are formed over the substrate 102 and on opposing sides of the fin structure 112. As an example to form the STI regions 118, an insulation material may be formed over the substrate 102. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 112. In some embodiments, a liner is first formed along surfaces of the substrate 102 and fin structure 112, and a fill material, such as those discussed above is formed over the liner. In some embodiments, the liner is omitted.

Next, a removal process is applied to the insulation material to remove excess insulation material over the fin structure 112. In some embodiments, a planarization process such as a chemical mechanical polish (CMP), an etch back process, combinations thereof, or the like may be utilized. The planarization process exposes the nanostructure 114 such that top surfaces of the nanostructure 114 and the insulation material are level after the planarization process is complete. Next, the insulation material is recessed to form the STI regions 118. The insulation material is recessed such that the nanostructure 114 protrudes from between neighboring STI regions 118. Top portions of the semiconductor fin 104 may also protrude from between neighboring STI regions 96. Further, the top surfaces of the STI regions 118 may have a flat surface as illustrated, a convex surface, a concave surface (such as dishing), or a combination thereof. The top surfaces of the STI regions 118 may be formed flat, convex, and/or concave by an appropriate etch. The STI regions 118 may be recessed using an acceptable etching process, such as one that is selective to the material of the insulation material (e.g., etches the material of the insulation material at a faster rate than the material of the semiconductor fins 104 and the nanostructures 114). For example, a chemical oxide removal with a suitable etchant such as dilute hydrofluoric (dHF) acid may be used.

Still referring to FIGS. 4A and 4B, a dummy gate dielectric 120 is formed over the nanostructure 114 and over the STI region 118. The dummy gate dielectric 120 may be, for example, silicon oxide, silicon nitride, a combination thereof, or the like, and may be deposited or thermally grown according to acceptable techniques. In an embodiment, a layer of silicon is conformally formed over the nanostructure 114 and over the upper surface of the STI regions 118, and a thermal oxidization process is performed to convert the deposited silicon layer into an oxide layer as the dummy gate dielectric 120.

Figure 5B:
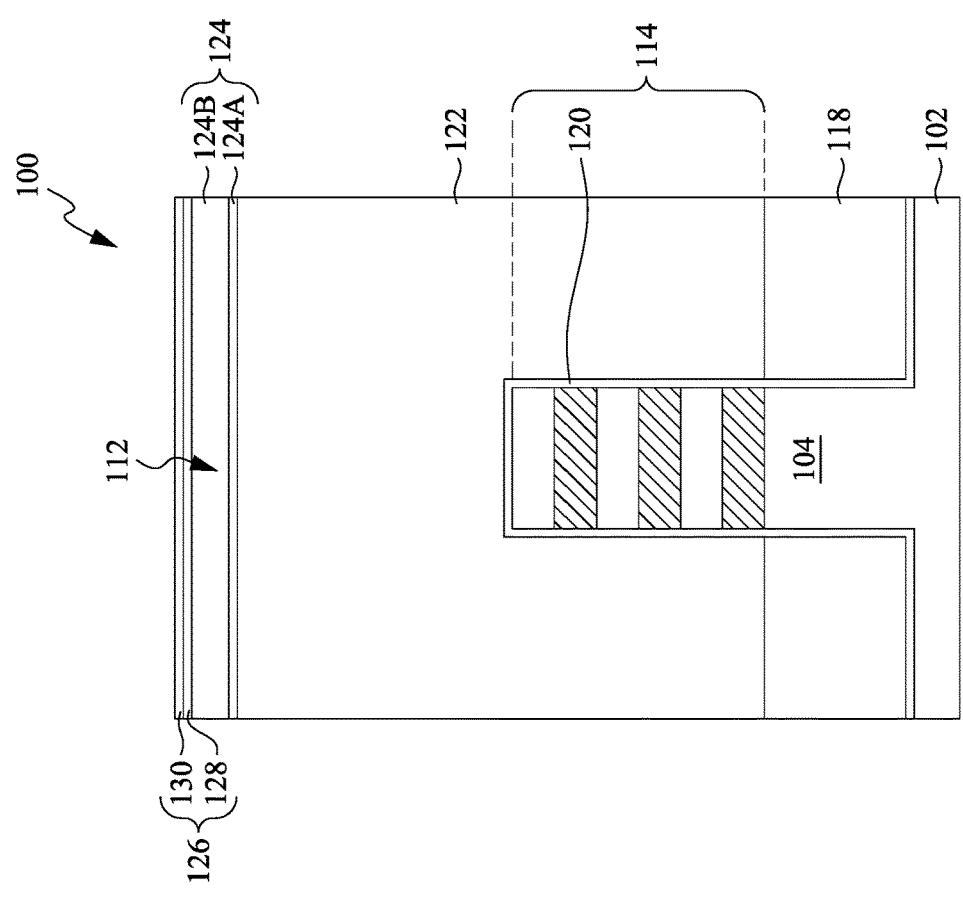
Figure 5A:
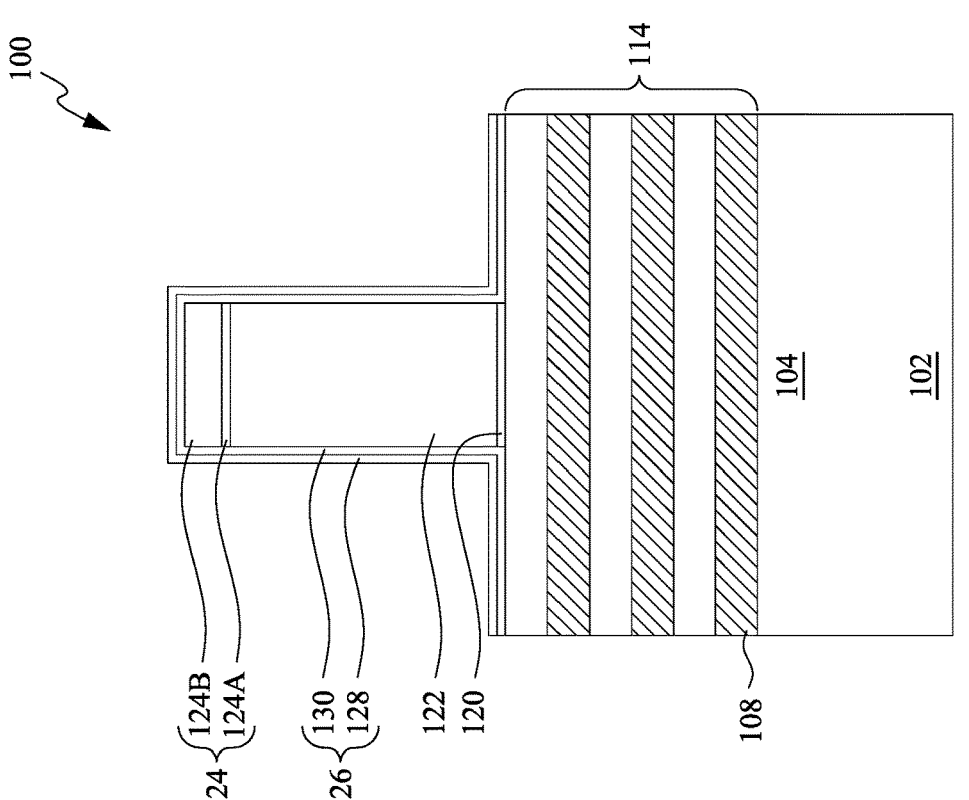

Next, in FIGS. 5A and 5B, a dummy gate 122 are formed over the fin 104 and over the nanostructure 114. To form the dummy gate 122, a dummy gate layer may be formed over the dummy gate dielectric 120. The dummy gate layer may be deposited over the dummy gate dielectric 120 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 118.

Masks 124 are then formed over the dummy gate layer. The masks 124 may be formed from silicon nitride, silicon oxynitride, combinations thereof, or the like, and may be patterned using acceptable photolithography and etching techniques. In the illustrated embodiment, the mask 124 includes a first mask layer 124A (e.g., a silicon oxide layer) and a second mask layer 124B (e.g., a silicon nitride layer). The pattern of the masks 124 is then transferred to the dummy gate layer by an acceptable etching technique to form the dummy gate 122, and then transferred to the dummy dielectric layer by acceptable etching technique to form dummy gate dielectrics 120. The dummy gate 122 cover respective channel regions of the nanostructures 114. The pattern of the masks 124 may be used to physically separate the dummy gate 122 from adjacent dummy gates 122. The dummy gate 122 may also have a lengthwise direction substantially perpendicular to the lengthwise direction of the fins 104. The dummy gate 122 and the dummy gate dielectric 120 are collectively referred to as dummy gate structure, in some embodiments.

Next, a gate spacer layer 126 is formed by conformally depositing an insulating material over the nanostructure 114, the STI regions 118, and the dummy gate 122. The insulating material may be silicon nitride, silicon carbonitride, a combination thereof, or the like. In some embodiments, the gate spacer layer 126 includes multiple sublayers. For example, a first sublayer 128 (sometimes referred to as a gate seal spacer layer) may be formed by thermal oxidation or a deposition, and a second sublayer 130 (sometimes referred to as a main gate spacer layer) may be conformally deposited on the first sublayer 128.

Figure 6:
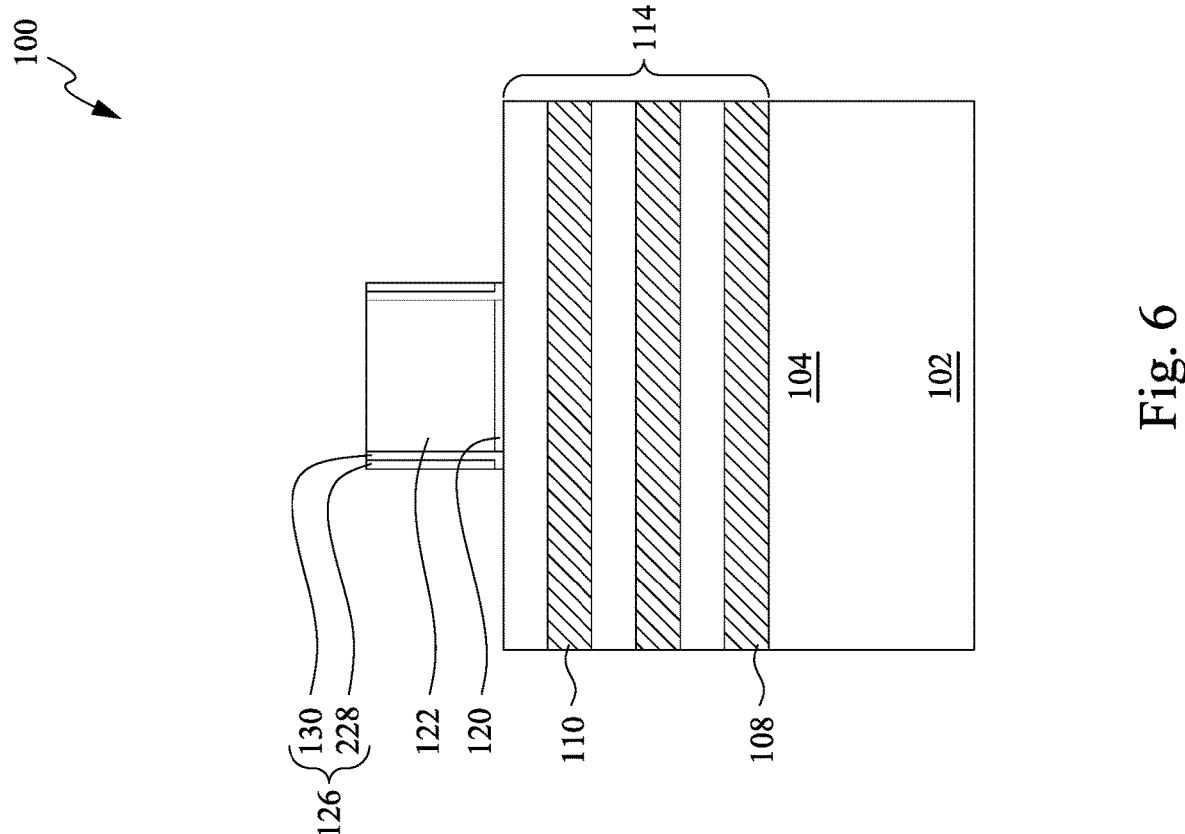

Next, in FIG. 6, the gate spacer layer 126 is etched by an anisotropic etching process to form gate spacers 126. The anisotropic etching process may remove horizontal portions of the gate spacer layer 126 (e.g., portions over the STI regions 118 and the dummy gate 122), with remaining vertical portions of the gate spacer layer 126 (e.g., along sidewalls of the dummy gate 122 and the dummy gate dielectric 120) forming the gate spacers 126.

After the formation of the gate spacers 126, implantation for lightly doped source/drain (LDD) regions (not shown) may be performed. Appropriate type (e.g., p-type or n-type) impurities may be implanted into the exposed nanostructure 114 and/or the semiconductor fin 104. The n-type impurities may be the any suitable n-type impurities, such as phosphorus, arsenic, antimony, or the like, and the p-type impurities may be the any suitable p-type impurities, such as boron, BF2, indium, or the like. An anneal process may be used to activate the implanted impurities.

Figure 7:
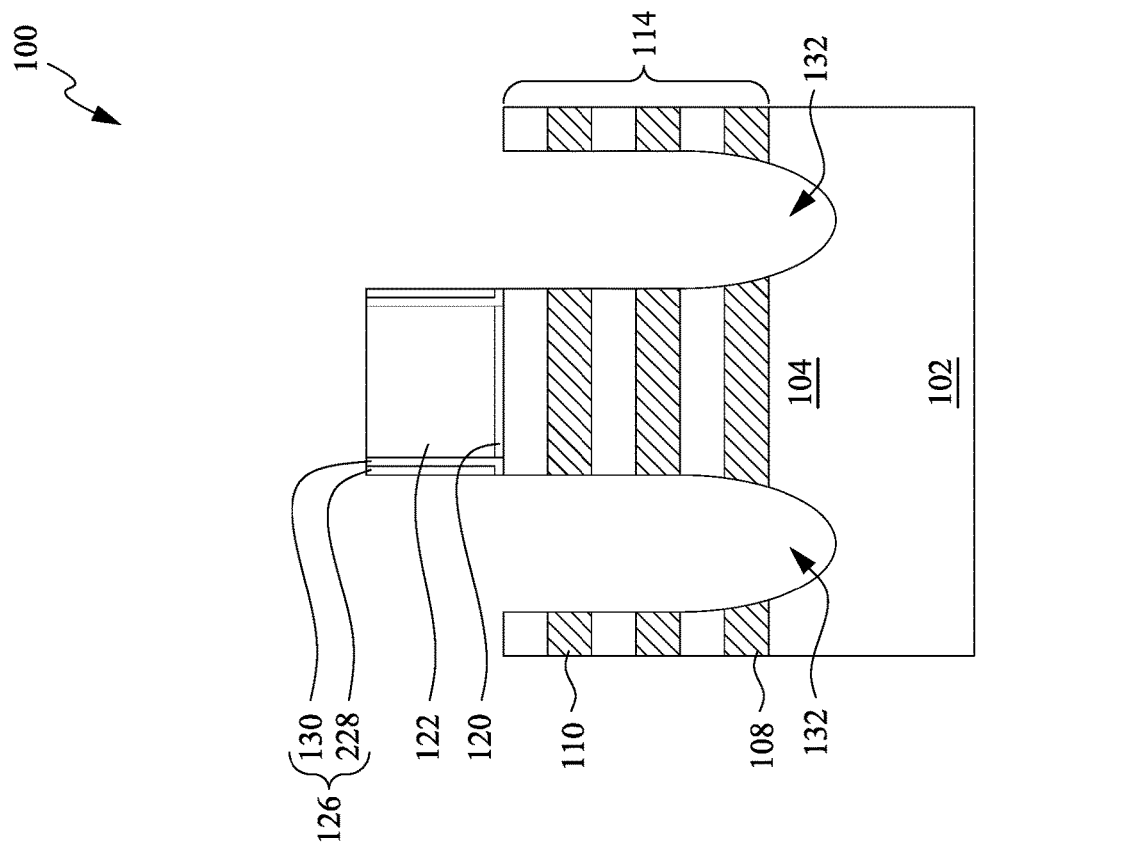

Next, in FIG. 7, openings 132 (may also be referred to as recesses) are formed in the nanostructure 114. The openings 132 may extend through the nanostructure 114 and into the semiconductor fin 104. The openings 132 may be formed by any acceptable etching technique, using, e.g., the dummy gate 122 as an etching mask. The openings 132 exposes end portions of the semiconductor material 108 and end portions of the silicon material 110.

Figure 8:
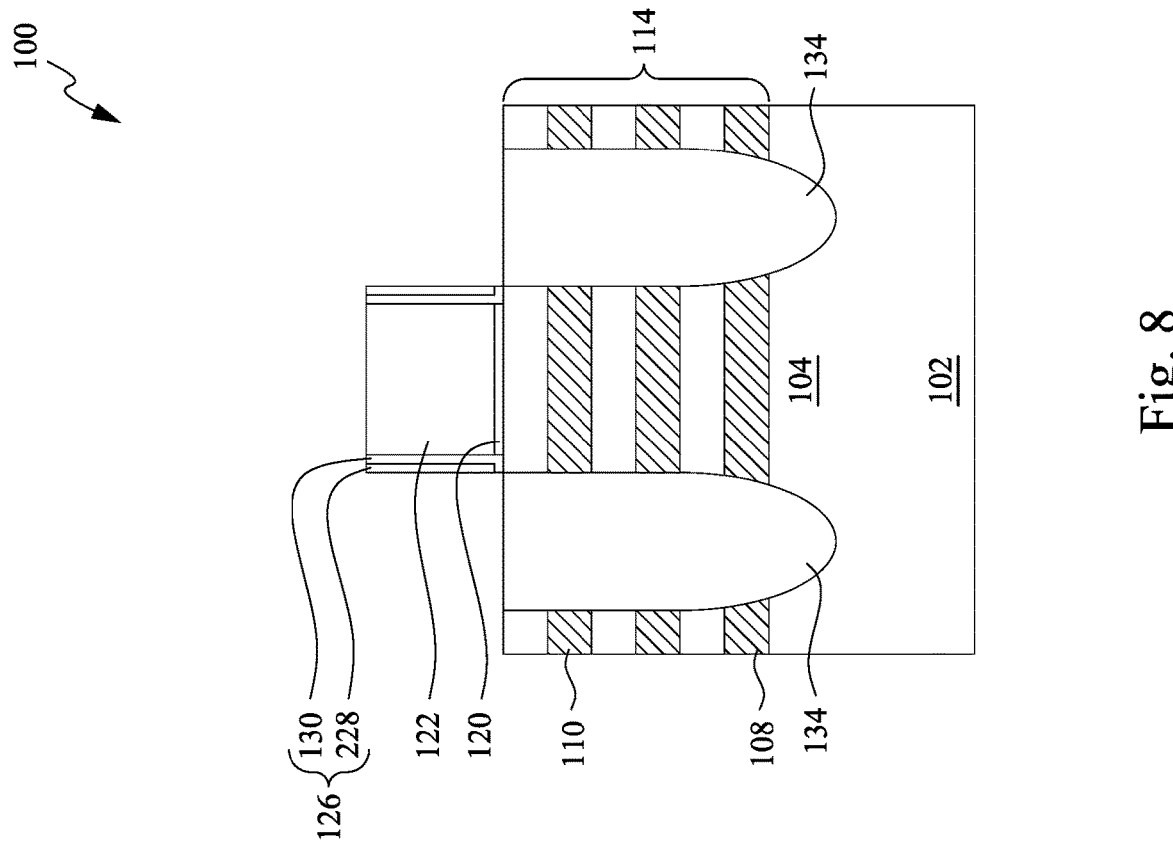

Next, in FIG. 8, source/drain regions 134 are formed in the openings 132. In some embodiments, the source/drain regions 134 are formed of an epitaxial material(s), and therefore, may also be referred to as epitaxial source/drain regions 134. In some embodiments, the epitaxial source/drain regions 134 are formed in the openings 132 to exert stress in the respective channel regions of the NSFET device 100 formed, thereby improving carrier mobility. In addition to exerting stress in the channel regions by the source/drain regions 134, the channel regions of the NSFET device 100 may be implanted to enhance the carrier mobility, which will be described in greater detail below. The epitaxial source/drain regions 134 are formed such that the dummy gate 122 is disposed between neighboring pairs of the epitaxial source/drain regions 134. In some embodiments, the gate spacers 126 are used to separate the epitaxial source/drain regions 134 from the dummy gate 122 by an appropriate lateral distance so that the epitaxial source/drain regions 134 do not short out subsequently formed gate of the resulting NSFET device 100.

The epitaxial source/drain regions 134 are epitaxially grown in the openings 132, in some embodiments. The epitaxial source/drain regions 134 may include any acceptable material, such as appropriate for n-type or p-type device. For example, when n-type devices are formed, the epitaxial source/drain regions 134 may include materials exerting a tensile strain in the channel regions, such as silicon, SiC, SiCP, SiP, or the like. Likewise, when p-type devices are formed, the epitaxial source/drain regions 134 may include materials exerting a compressive strain in the channel regions, such as SiGe, SiGeB, Ge, GeSn, or the like. The epitaxial source/drain regions 134 may have surfaces raised from respective surfaces of the fins and may have facets.

The epitaxial source/drain regions 134 and/or the fins 104 may be implanted with dopants to form source/drain regions, similar to the process previously discussed for forming lightly-doped source/drain regions, followed by an anneal. The n-type and/or p-type impurities for source/drain regions may be any of the impurities previously discussed. In some embodiments, the epitaxial source/drain regions 134 may be in situ doped during growth.

As a result of the epitaxy processes used to form the epitaxial source/drain regions 134, upper surfaces of the epitaxial source/drain regions 134 have facets which expand laterally outward beyond sidewalls of the fin 90. In some embodiments, adjacent epitaxial source/drain regions 134 disposed over adjacent fins 104 remain separated after the epitaxy process is completed. In other embodiments, these facets cause adjacent epitaxial source/drain regions 134 disposed over adjacent fins 104 of a same NSFET to merge.

Figure 9B:
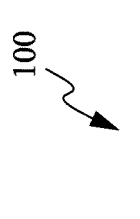
Figure 9B:
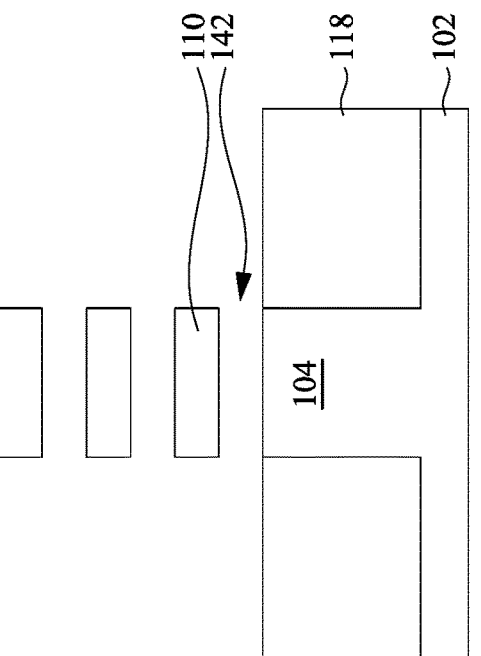
Figure 9A:
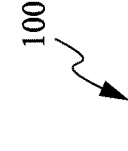
Figure 9A:
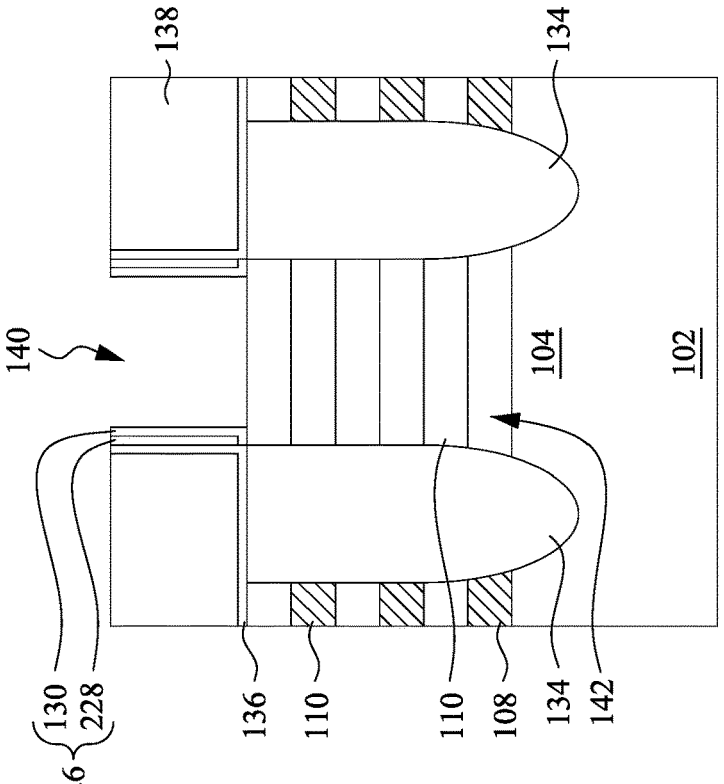

Next, in FIGS. 9A-9B, a contact etch stop layer (CESL) 136 is formed (e.g., conformally) over the source/drain regions 134 and over the dummy gate 122, and a first inter-layer dielectric (ILD) 138 is then deposited over the CESL 136. The CESL 136 is formed of a material having a different etch rate than the first ILD 138, and may be formed of silicon nitride using PECVD, although other dielectric materials such as silicon oxide, silicon oxynitride, combinations thereof, or the like, and alternative techniques of forming the CESL 136, such as low pressure CVD (LPCVD), PVD, or the like, could be used.

The first ILD 138 may be formed of a dielectric material, and may be deposited by any suitable method, such as CVD, plasma-enhanced CVD (PECVD), or FCVD. Dielectric materials for the first ILD 138 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Next, the dummy gate 122 is removed. To remove the dummy gate 122, a planarization process, such as a CMP, may be performed to level the top surfaces of the first ILD 138 and CESL 136 with the top surfaces of the dummy gate 122 and gate spacers 126. The planarization process may also remove the masks 124 (see FIG. 5A) on the dummy gate 122 (if the mask 124 has not been removed by the anisotropic etching process to form the gate spacers 126), and portions of the gate spacers 126 along sidewalls of the masks 124. After the planarization process, top surfaces of the dummy gate 122, gate spacers 126, and first ILD 138 are level. Accordingly, the top surface of the dummy gate 122 is exposed at the upper surface of the first ILD 138.

After the planarization process, the dummy gate 122 is removed in an etching step(s), so that a recess 140 (may also be referred to as an opening 140) is formed between the gate spacers 126. In some embodiments, the dummy gate 122 is removed by an anisotropic dry etch process. For example, the etching process may include a dry etch process using reaction gas(es) that selectively etch the dummy gate 122 without etching the first ILD 138 or the gate spacers 126. The recess 140 exposes the channel regions of the NSFET device 100. The channel regions are disposed between neighboring pairs of the epitaxial source/drain regions 134. During the removal of the dummy gate 122, the dummy gate dielectric 120 may be used as an etch stop layer when the dummy gate 122 is etched. The dummy gate dielectric 120 may then be removed after the removal of the dummy gate 122. After removal of the dummy gate 122, the semiconductor material 108 and the silicon material 110 that were disposed under the dummy gate 122 are exposed by the recess 140.

Next, the semiconductor material 108 is removed to release the silicon material 110. After the semiconductor material 108 is removed, the silicon material 110 forms a plurality of nanosheets 110 that extend horizontally (e.g., parallel to a major upper surface of the substrate 102). The nanosheets 110 may be collectively referred to as the channel regions or the channel layers of the NSFET device 100 formed. As illustrated in FIGS. 9A-9B, gaps 142 (e.g., empty spaces) are formed between the nanosheets 110 by the removal of the semiconductor material 108. The nanosheets 110 may also be referred to as nanowires, and the NSFET device 100 may also be referred to as a gate-all-around (GAA) device, in some embodiments.

In some embodiments, the semiconductor material 108 is removed by a selective etching process using an etchant that is selective to (e.g., having a higher etch rate for) the semiconductor material 108, such that the semiconductor material 108 is removed without substantially attacking the silicon material 110. In an embodiment, an isotropic etching process is performed to remove the semiconductor material 108. The isotropic etching process may be performed using an etching gas, and optionally, a carrier gas. In some embodiments, the etching gas comprises HF, a mixture of F2 and HF, or the like, and the carrier gas may be an inert gas such as Ar, He, $N_2$, combinations thereof, or the like. In some embodiments, an etchant such as dissolved ozone in de-ionized water (DIO) is used to selectively remove the semiconductor material 108.

Figure 10B:
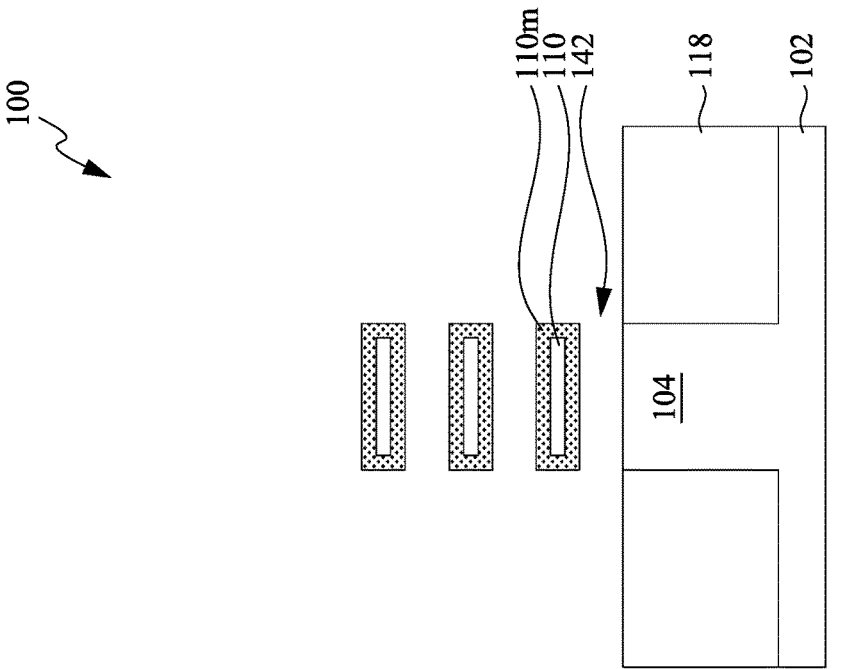
Figure 10A:
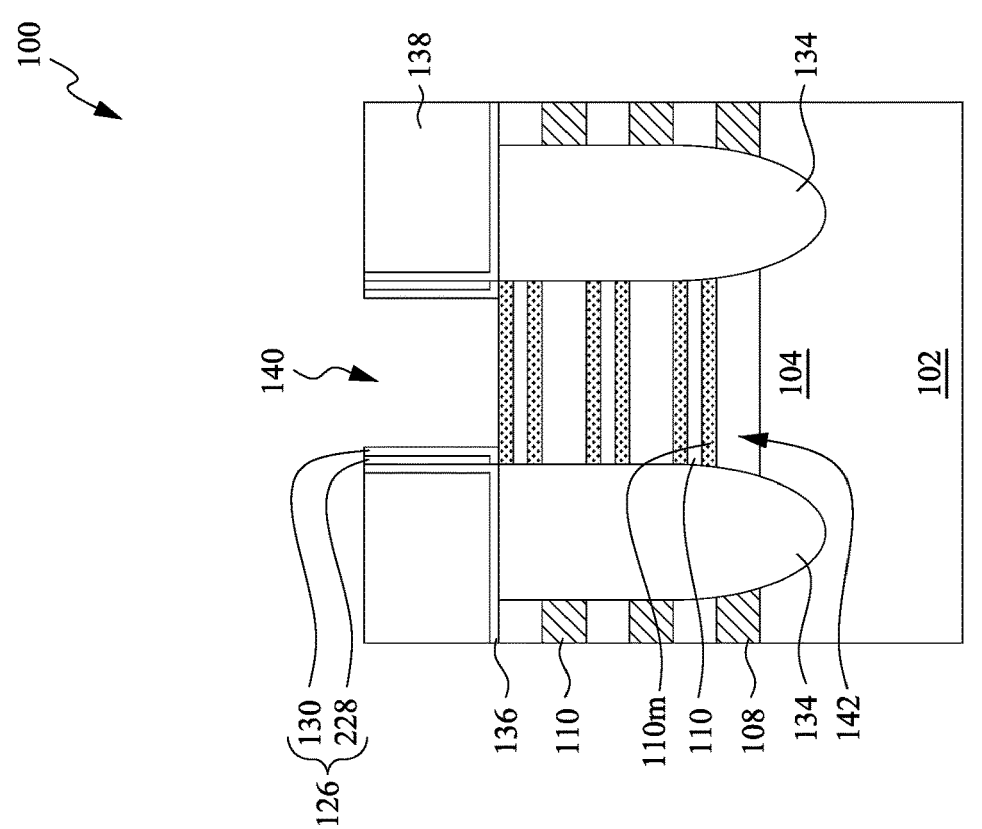

Next, in FIGS. 10A-10B, after the recess 140 and the gaps 142 are formed, an ion implantation process is performed to implant impurities (i.e., dopant ions). In some embodiments, the ion implantation process includes an ion implantation with oxygen species, ozone species, or a combination thereof to introduce oxygen into the nanosheets 110 to form an implanted region 110*m* having an oxygen concentration gradient. The oxygen atoms occupy interstitial sites in a crystal lattice of the silicon material of the nanosheets 110. Incorporating oxygen into the nanosheets 110 allows for reduction of the electron effective mass. Compared with a reference design where the silicon channels are not incorporated with oxygen, a 20%±2% reduction in the effective electron mass is achieved. Since the electron effective mass is related to the carrier mobility and the source/drain resistance, due to the reduced electron effective mass, carrier mobility in the nanosheets 110 can be enhanced and the source/drain resistance can be decreased, thereby enhancing drive current of the NSFET device 100 and thus improving device performance of the NSFET device 100.

Figure 11B:
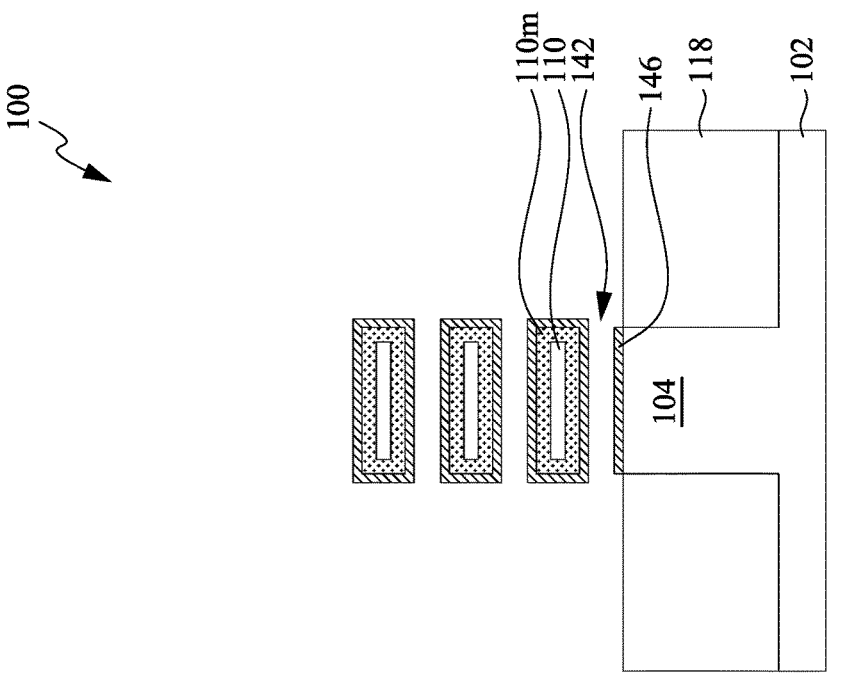
Figure 11A:
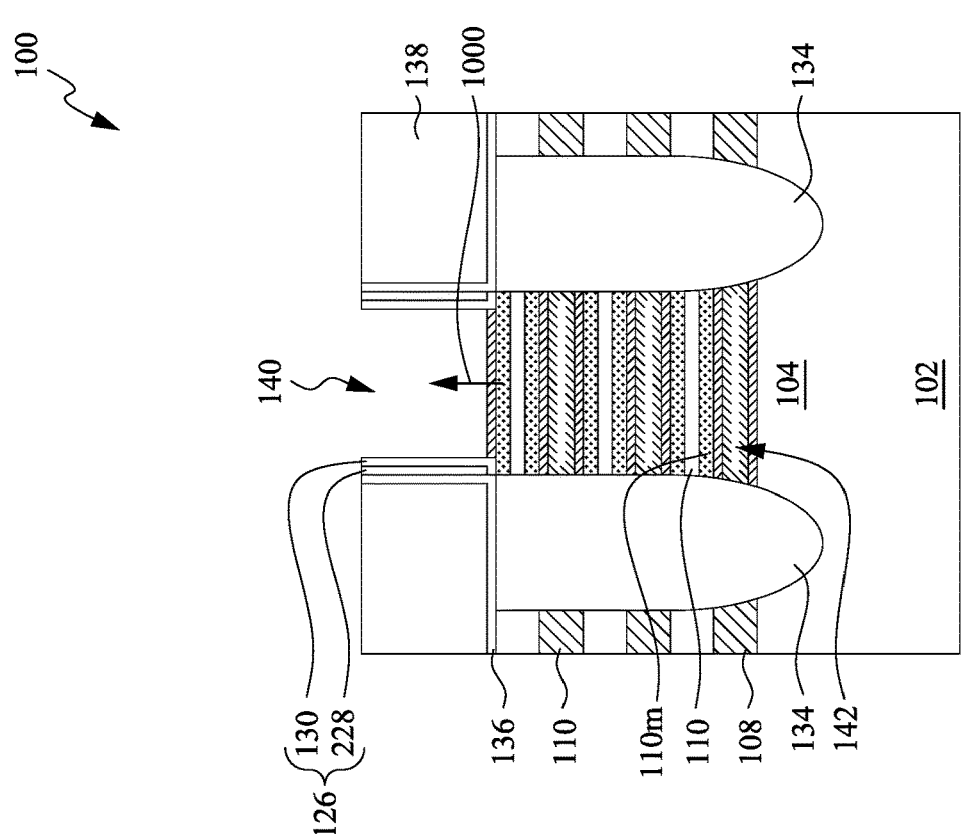

Next, in FIGS. 11A-11B, an interfacial layer 146 is formed (e.g., conformally) in the recess 140 and in the gaps 142. The interfacial layer 146 wraps around the nanosheets 110 and extends along the upper surface of the fin 104. For example, the interfacial layer 146 is in contact with the implanted region 110m. The interfacial layer 146 may be a silicon oxide-containing layer. For example, the interfacial layer 146 may include a dielectric material such as silicon oxide ($SiO_2$) or silicon oxynitride (SiON). The interfacial layer 146 may be formed by chemical oxidation, thermal oxidation, atomic layer deposition (ALD), chemical vapor deposition (CVD), and/or other suitable method.

Figure 11C:
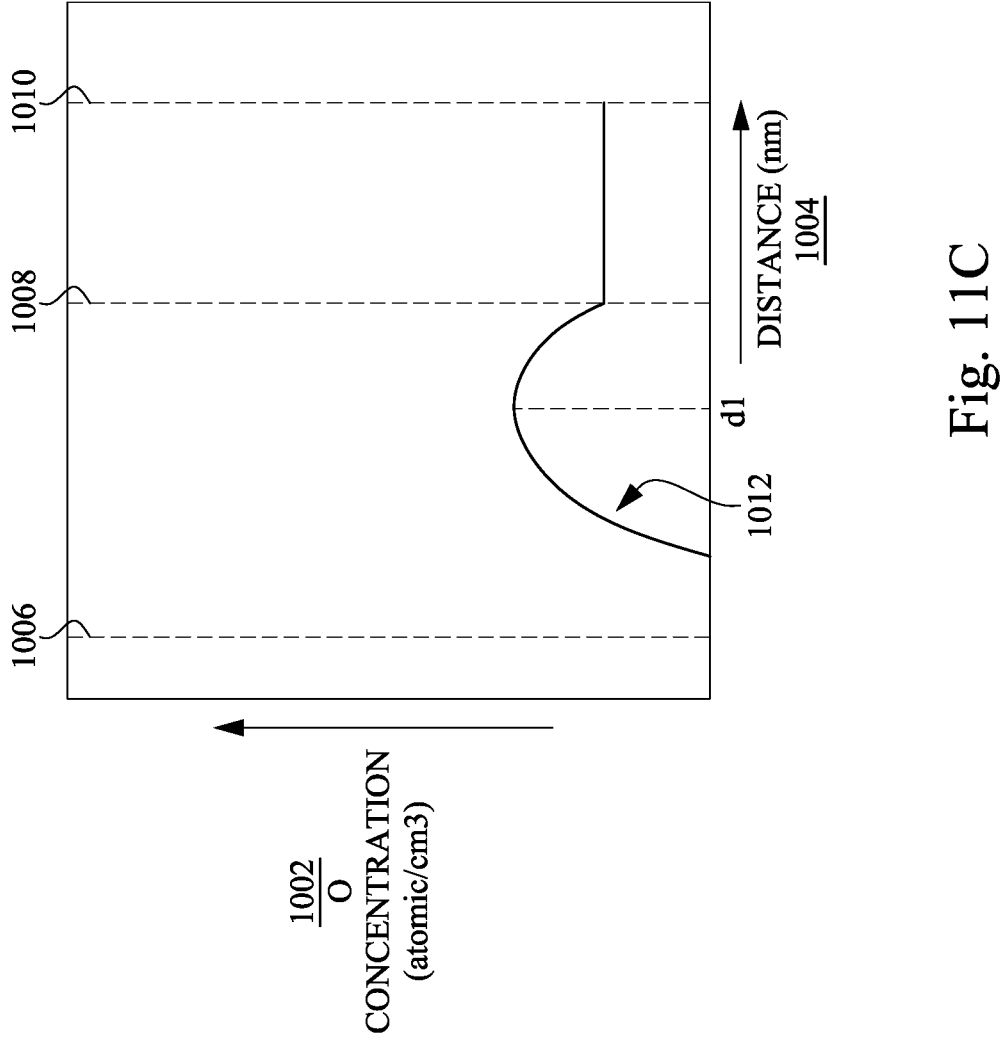
FIG. 11C is a graph of oxygen concentration by distance in the nanosheets and the interfacial layer of the NSFET device along line 1000 in FIG. 11A.

FIG. 11C is a graph of oxygen concentration by distance in the nanosheets 110 and the interfacial layer 146 of the NSFET device 100 along line 1000 in FIG. 11A. The y-axis 1002 indicates the oxygen concentration in atoms/cm3. The x-axis 1004 indicates the distance in nanometers (nm). The vertical dashed line 1006 indicates a center of one of the nanosheets 110. The vertical dashed line 1008 indicates an interface between the one of the nanosheets 110 and the interfacial layer 146. The vertical dashed line 1010 indicates an outermost surface of the interfacial layer 146 facing away from the one of the nanosheets 110. The solid curve 1012 shows the oxygen concentration along the line 1000 in FIG. 11A in accordance with one embodiment. Each of the nanosheets 110 has a non-uniform oxygen concentration profile. As can be seen from the graph, the nanosheet 110 has an oxygen concentration profile different from an oxygen concentration profile of the interfacial layer 146. For example, the oxygen concentration profile of the nanosheets 110 has a peak concentration at a depth d1 in one of the nanosheets 110. The oxygen concentration profile of the interfacial layer 146 shows a substantially uniform oxygen concentration through the entire film depth of interfacial layer 146. In other words, the oxygen concentration profile of the nanosheet 110 has a greater concentration variation than the oxygen concentration profile of the interfacial layer 146.

Figure 12B:
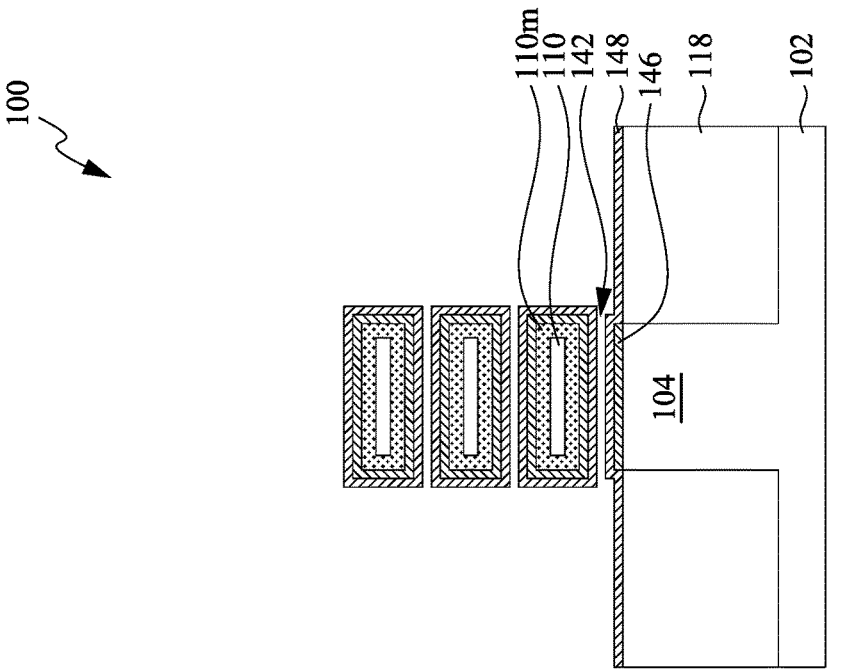
Figure 12A:
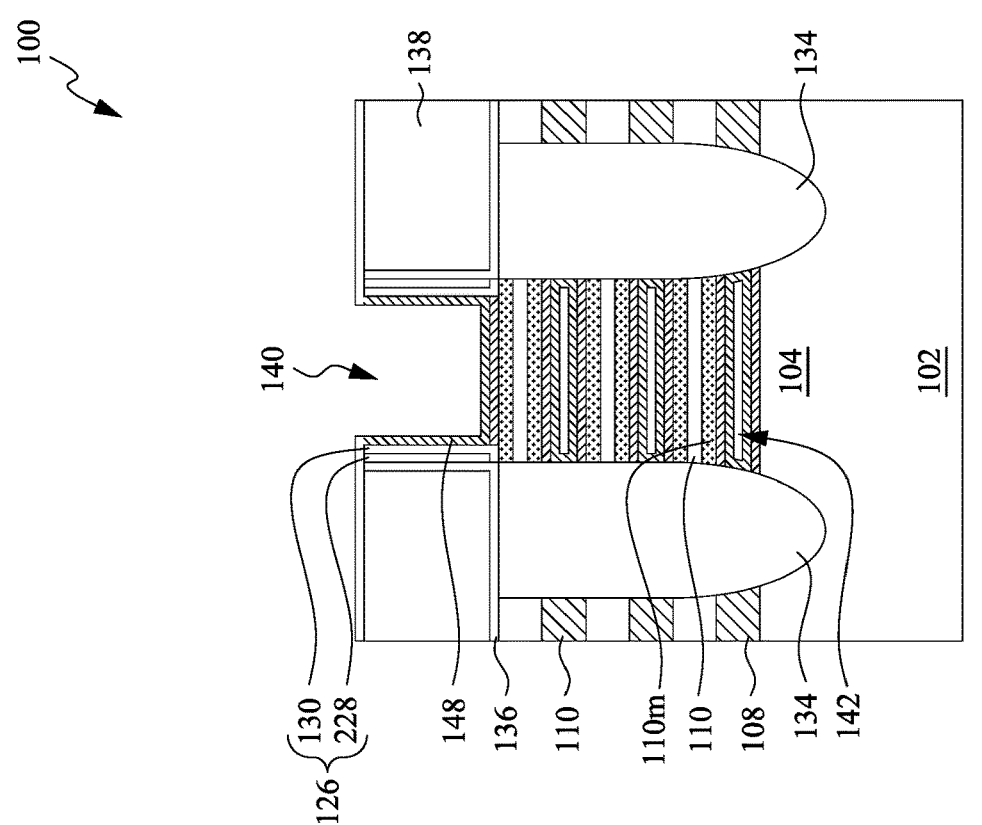

Next, in FIGS. 12A-12B, a gate dielectric layer 148 is formed (e.g., conformally) in the recess 140 and in the gaps 142. The gate dielectric layer 148 wraps around the nanosheets 110, lines sidewalls of the gate spacers 107, and extends along the upper surface and sidewalls of the fin 90. In accordance with some embodiments, the gate dielectric layer 148 comprises silicon oxide, silicon nitride, or multilayers thereof. In some embodiments, the gate dielectric layer 148 includes a high-k dielectric material, and in these embodiments, the gate dielectric layer 148 may have a dielectric constant greater than about 7.0, and may include a metal oxide or a silicate of Hf, Al, Zr, La, Mg, Ba, Ti, or Pb, or combinations thereof. The formation methods of gate dielectric layer 148 may include Molecular-Beam Deposition (MBD), ALD, PECVD, and the like.

Figure 13B:
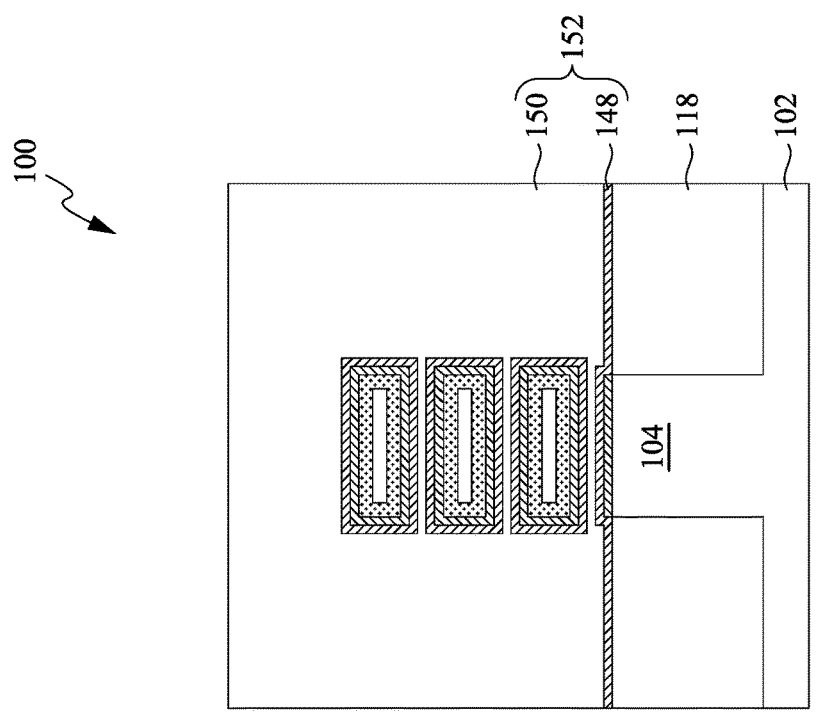
Figure 13A:
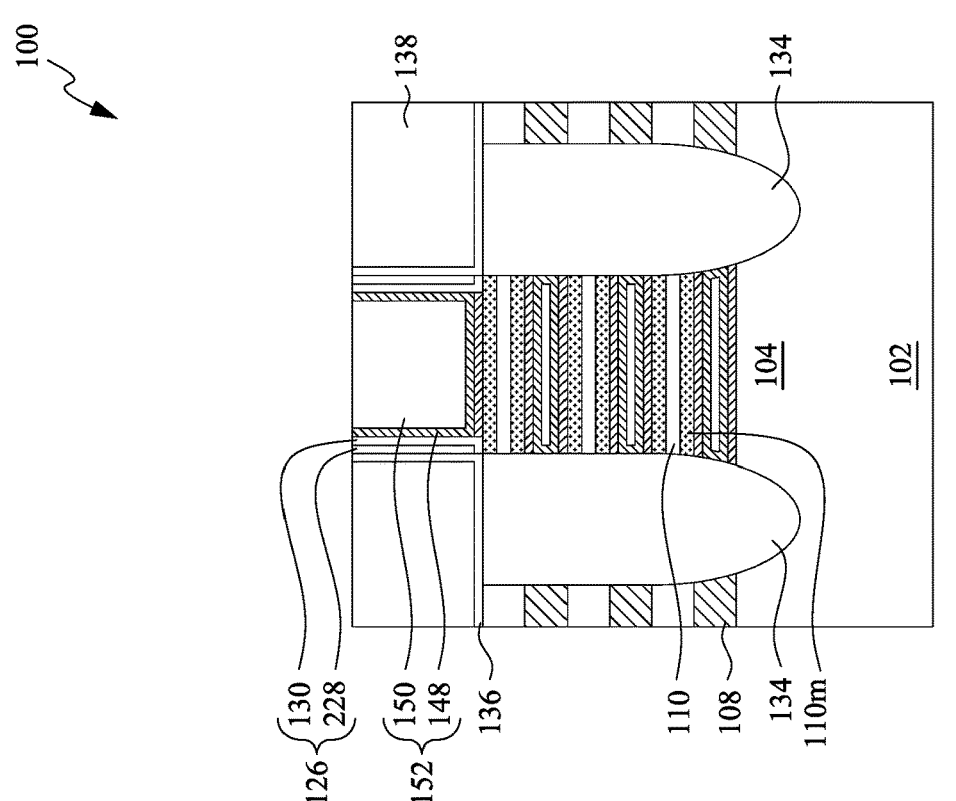
Figure 14:
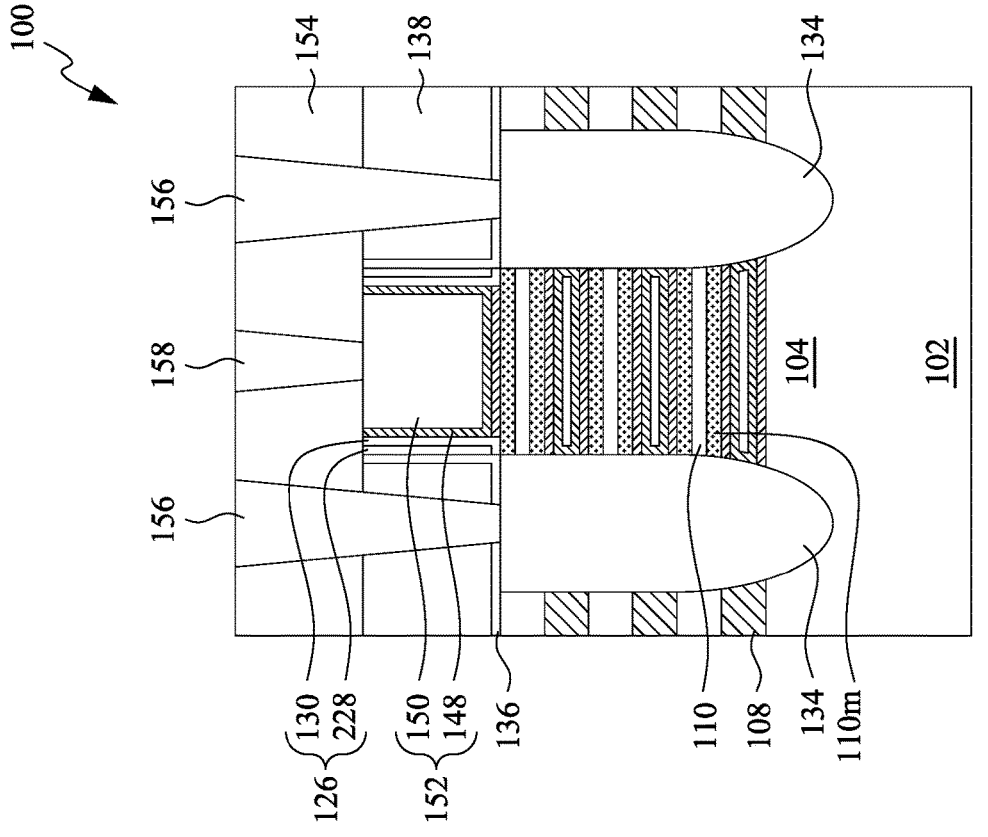

Reference is made to FIGS. 13A-13B. Next, a gate electrode material (e.g., an electrically conductive material) is formed in the recess 140 and gaps 142 to form the gate electrode 150. The gate electrode 150 fills the remaining portions of the recess 140 and the gaps 142. The gate electrode 150 may be made of a metal-containing material such as Cu, Al, W, the like, combinations thereof, or multi-layers thereof, and may be formed by, e.g., electroplating, electroless plating, or other suitable method. After the filling of the gate electrodes 150, a planarization process, such as a CMP, may be performed to remove the excess portions of the gate dielectric layer 148 and the material of the gate electrodes 150, which excess portions are over the top surface of the first ILD 138. The remaining portions of material of the gate electrode 150 and the gate dielectric layer 148 thus form replacement gate of the resulting NSFET device 100. The gate electrode 150 and the corresponding gate dielectric layer 148 may be collectively referred to as a gate stack 152, a replacement gate structure 152, or a metal gate structure 152. Each gate stack 152 extends over and around the respective nanosheets 110.

Although the gate electrode 150 is illustrated as a single layer in the example of FIGS. 13A-13B, one skilled in the art will readily appreciate that the gate electrode 150 may have a multi-layered structure and may include a plurality layers, such as a barrier layer, a work function layer, a seed layer and a fill metal.

For example, a barrier layer may be formed conformally over the gate dielectric layer 148. The barrier layer may comprise an electrically conductive material such as titanium nitride, although other materials, such as tantalum nitride, titanium, tantalum, or the like, may alternatively be utilized. A work function layer may be formed over the barrier layer. Exemplary p-type work function materials (may also be referred to as p-type work function metals) include TiN, TaN, Ru, Mo, Al, WN, ZrSi2, MoSi2, TaSi2, NiSi2, WN, other suitable p-type work function materials, or combinations thereof. Exemplary n-type work function materials (may also be referred to as n-type work function metals) include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the work function layer is chosen to tune its work function value so that a target threshold voltage VTH is achieved in the device that is to be formed. Next, a seed layer may be formed over the work function layer. The seed layer may be formed of tungsten, copper, or copper alloys, although other suitable materials may alternatively be used. Once the seed layer has been formed, the fill metal may be formed onto the seed layer, filling the recess 140 and gaps 142. The fill metal may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized.

Additional processing may be performed to finish fabrication of the NSFET device 100, as one of ordinary skill readily appreciates, thus details may not be repeated here. For example, referring to FIG. 14, a second ILD 154 may be deposited over the first ILD 138. Further, a gate contact 158 and source/drain contacts 156 may be formed extending through the second ILD 154 and/or the first ILD 138 to electrically couple to the gate electrode 150 and the source/drain regions 134, respectively.

Figure 15:
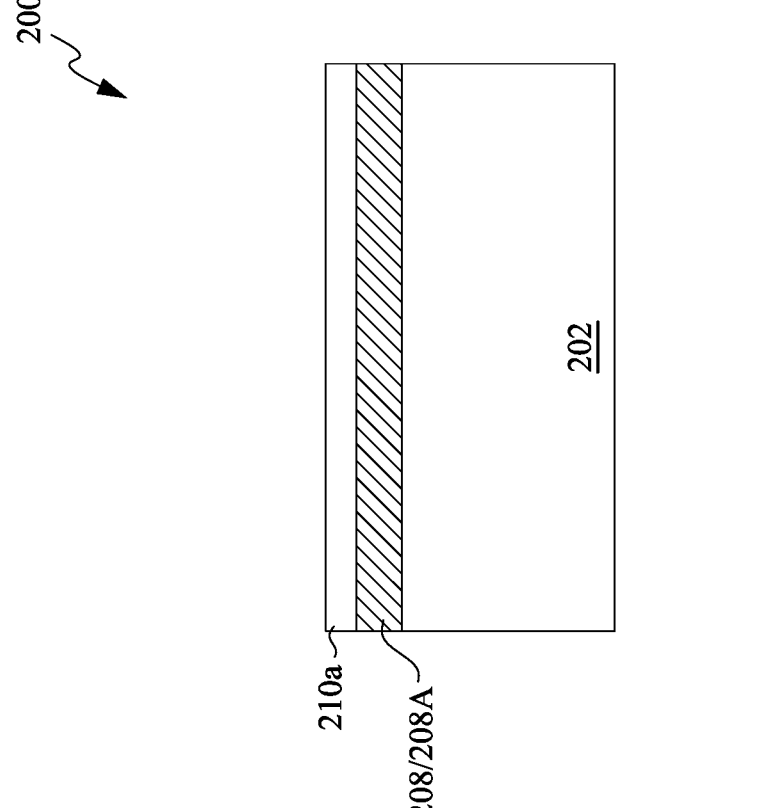
FIGS. 15, 16, 17, 18, 19, 20A-20B, 21A-21B, 22A-22B, 23, 24, 25, 26A-26B, 27A-27B, 28A-28B and 29 are cross-sectional views of a nanosheet field-effect transistor (NSFET) device 200 at various stages of manufacturing, in accordance with an embodiment.

FIGS. 15, 16, 17, 18, 19, 20A-20B, 21A-21B, 22A-22B, 23, 24, 25, 26A-26B, 27A-27B, 28A-28B and 29 are cross-sectional views of a nanosheet field-effect transistor (NSFET) device 200 at various stages of manufacturing, in accordance with an embodiment. In FIG. 15, a substrate 202 is provided. The substrate 202 may be a semiconductor substrate, such as a bulk semiconductor, a semiconductor-on-insulator (SOI) substrate, or the like, which may be doped (e.g., with a p-type or an n-type dopant) or undoped. The material of the substrate 202 may be similar to the material of the substrate 102 and the description thereof is not repeated herein for the sake of brevity. A semiconductor layer 208A of a semiconductor material 208 is formed on the substrate 202 at first. After the semiconductor layer 208A is formed, a first silicon sub-layer 210a is formed on the semiconductor layer 208A. The formation of the semiconductor layer 208A and the first silicon sub-layer 210a may be performed by an epitaxial growth process, which may be performed in a growth chamber. In some embodiments where the semiconductor material 208 is silicon germanium, in other words, the semiconductor layer 208A is a silicon germanium layer, during the formation of the semiconductor layer 208A and the first silicon sub-layer 210a, the growth chamber is exposed to a first set of precursors for selectivity growing the silicon germanium layer and then exposed to a second set of precursors for growing the silicon layer in some embodiments. In some embodiments, the first set of precursors includes a silicon precursor (e.g., silane) and a germanium precursor (e.g., a germane), and the second set of precursors includes the silicon precursor but omits the germanium precursor.

Figure 16:
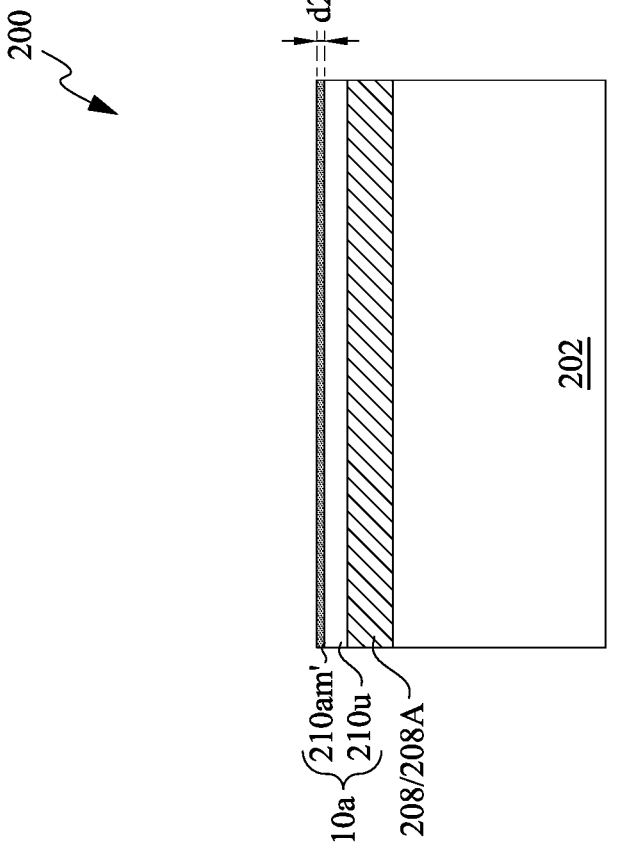

Referring to FIG. 16, an ion implantation process is performed to implant impurities (i.e., dopant ions). In some embodiments, the ion implantation process includes an ion implantation with oxygen species, ozone species, or a combination thereof to introduce oxygen into the first silicon sub-layer 210a to form an implanted region 210am' having an implant depth d2 while leaving an un-implanted region 210u under the implanted region 210am'. The oxygen atoms occupy interstitial sites in a crystal lattice of the first silicon sub-layer 206a.

Figure 17:
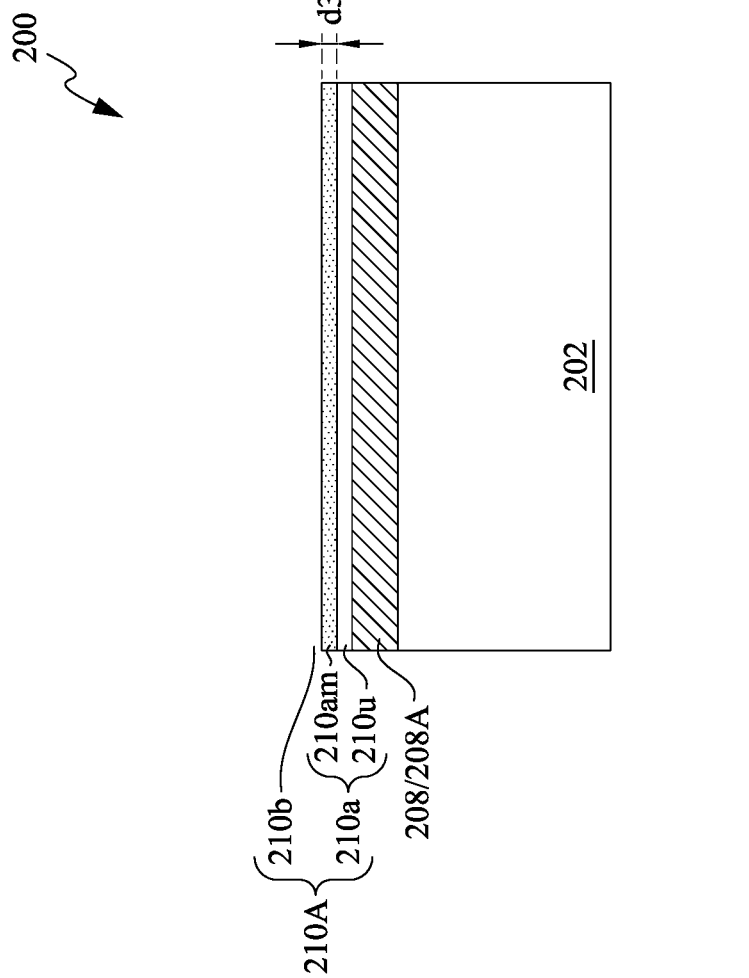

Next, in FIG. 17, an annealing operation is carried out to diffuse oxygen atoms from the implanted region 210am' toward the underlying un-implanted region 210u of the first silicon sub-layer 210a, forming an implanted region 210am. In this embodiment, the implanted region 210am extends deeper into the first silicon sub-layer 210a. For example, the implanted region 210am has a depth d3 greater than the implant depth d2 (see FIG. 16). After the annealing operation, the termination at the top surface of the first silicon sub-layer 210a can create silicon crystal lattices suitable for a subsequent epitaxial growing process.

Figure 18:
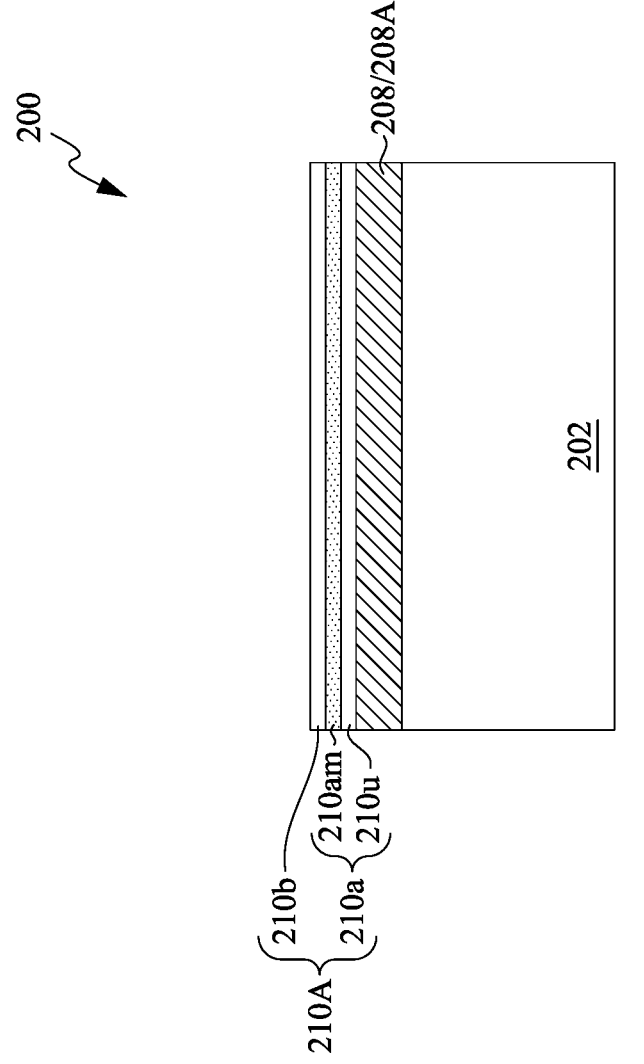

Next, a second silicon sub-layer 210b is formed over the implanted region 210am of the first silicon sub-layer 210a and is in contact with the implanted region 210am, as shown in FIG. 18. The second silicon sub-layer 210b is oxygen-free. The implanted region 210am is sandwiched between the second silicon sub-layer 210b and the un-implanted region 210u of the first silicon sub-layer 210a. The first silicon sub-layer 210a and the second silicon sub-layer 210b are collectively referred to as a silicon layer 210A of a silicon material.

Figure 19:
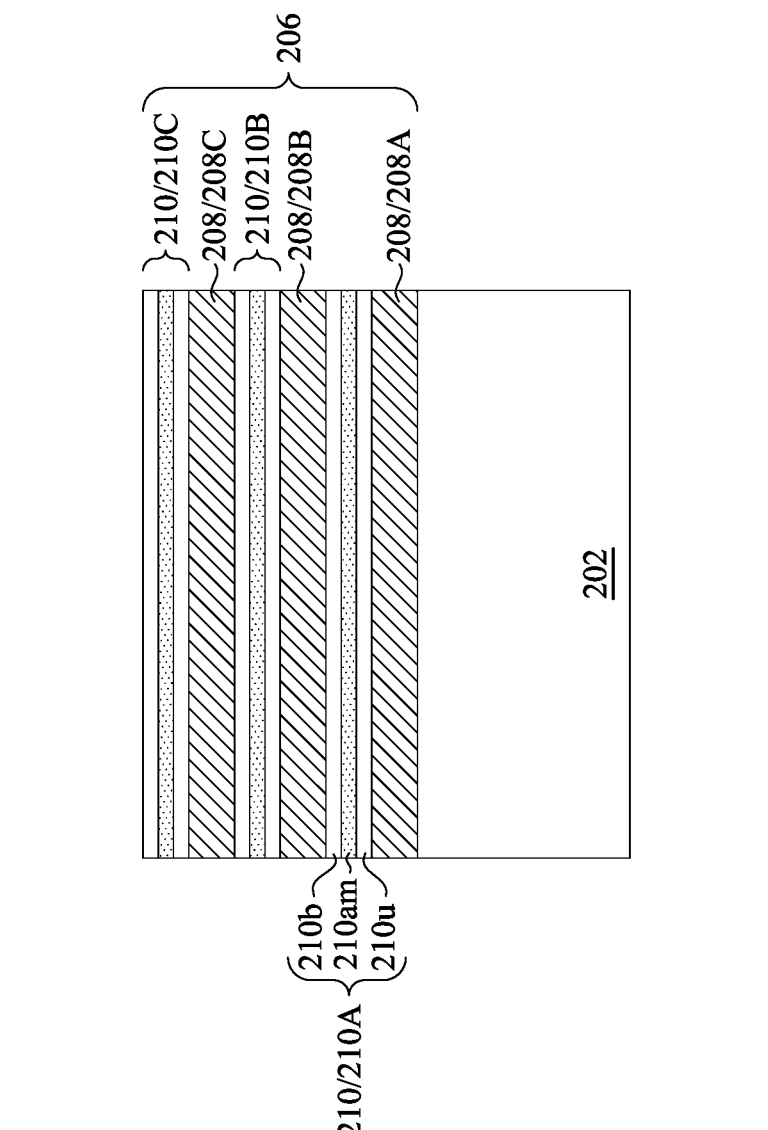

Reference is made to FIG. 19. A multi-layer stack 206 is formed by repeating these cycles to obtain a desired number of channel layers. For example, a semiconductor layer 208B of the semiconductor material 208 is then formed on the second silicon sub-layer 210b of the silicon layer 210A. Layers formed by the semiconductor material 208 are labeled as 208A, 208B and 208C. Layers formed by the first silicon sub-layer (which includes the un-implanted region 210u and the implanted region 210am) and the second silicon sub-layer 210b are labeled as 210A, 210B and 210C. The number of layers formed by these layers illustrated in FIG. 19 is merely non-limiting examples. Other numbers of layers are also possible and are fully intended to be includes within the scope of the present disclosure.

The silicon layers 210A, 210B and 210C are epitaxial materials suitable for forming channel regions of, e.g., n-type FETs. The multi-layer stack 206 (may also be referred to as an epitaxial material stack) will be patterned to form channel regions of the NSFET device 200 in subsequent processing. In particular, the multi-layer stack 206 will be patterned to form horizontal nanosheets, with the channel regions of the resulting NSFET including multiple horizontal nanosheets.

Figures 20A, 20B:
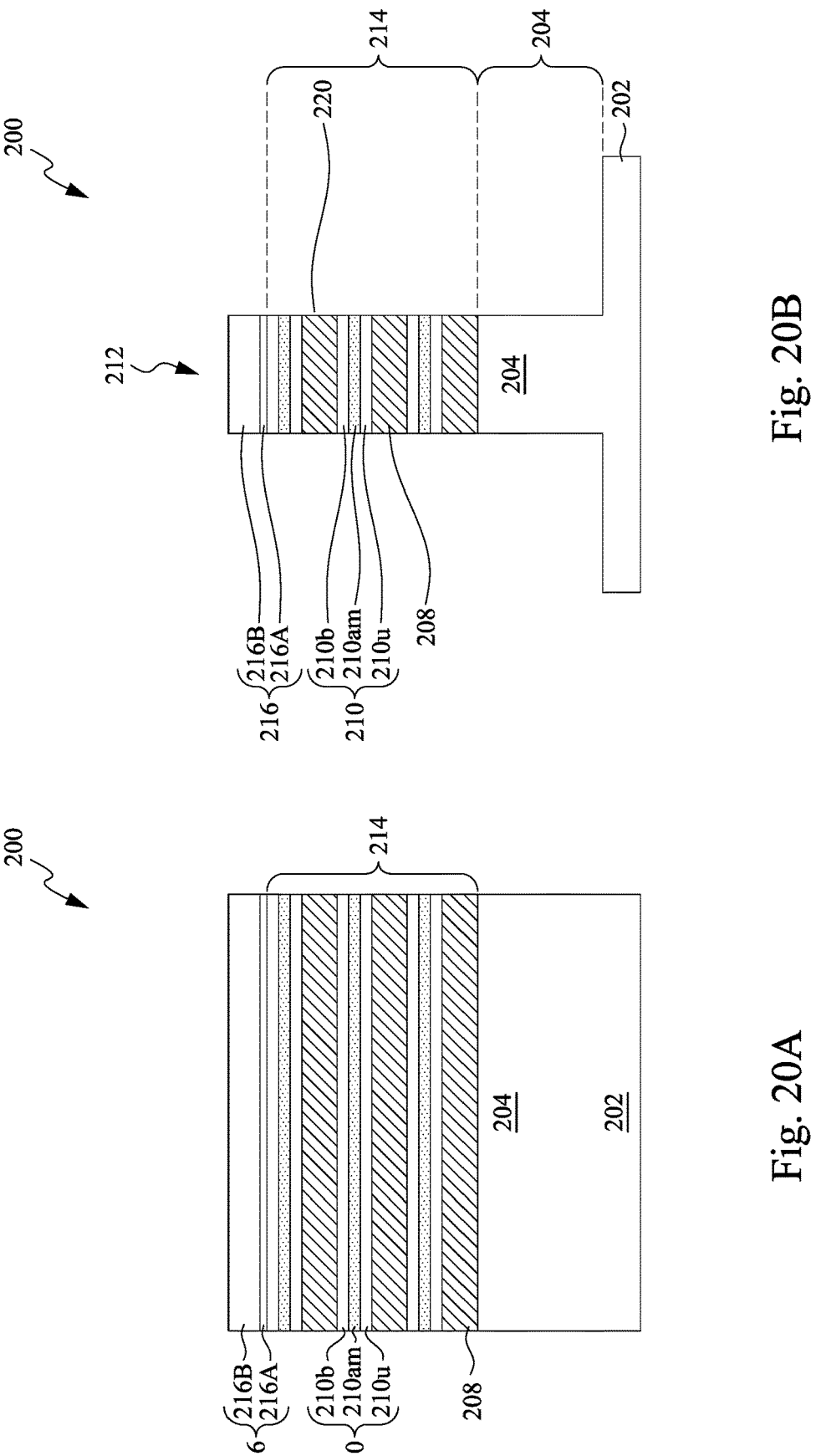

In FIGS. 20A and 20B, a fin structure 212 is formed protruding above the substrate 202. The fin structure 212 includes a semiconductor fin 204 and a nanostructure 214 overlying the semiconductor fin 204. The nanostructure 214 and the semiconductor fin 204 may be formed by etching trenches in the multi-layer stack 206 and the substrate 202, respectively.

The fin structure 212 may be patterned by any suitable method similar to the fin structure 112, and thus the description thereof is not repeated herein. In one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 212.

In some embodiments, the remaining spacers are used to pattern a mask 216, which is then used to pattern the fin structure 212. The mask 216 may be a single layer mask, or may be a multilayer mask such as a multilayer mask that includes a first mask layer 216A and a second mask layer 216B. Formation methods and materials of the first mask layer 216A and the second mask layer 216B are similar to the formation methods and the materials of the first mask layer 216A and the second mask layer 216B, respectively, and the description thereof is not repeated herein. The mask 216 may then be used as an etching mask to etch the substrate 202 and the multi-layer stack 206. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 206 form the nanostructure 214, and the patterned substrate 202 form the semiconductor fin 204, as illustrated in FIGS. 20A and 20B. Therefore, in the illustrated embodiment, the nanostructure 214 also includes alternating layers of the semiconductor material 208 and the silicon material 210, and the semiconductor fin 204 is formed of a same material (e.g., silicon) as the substrate 202.

Figures 21A, 21B:
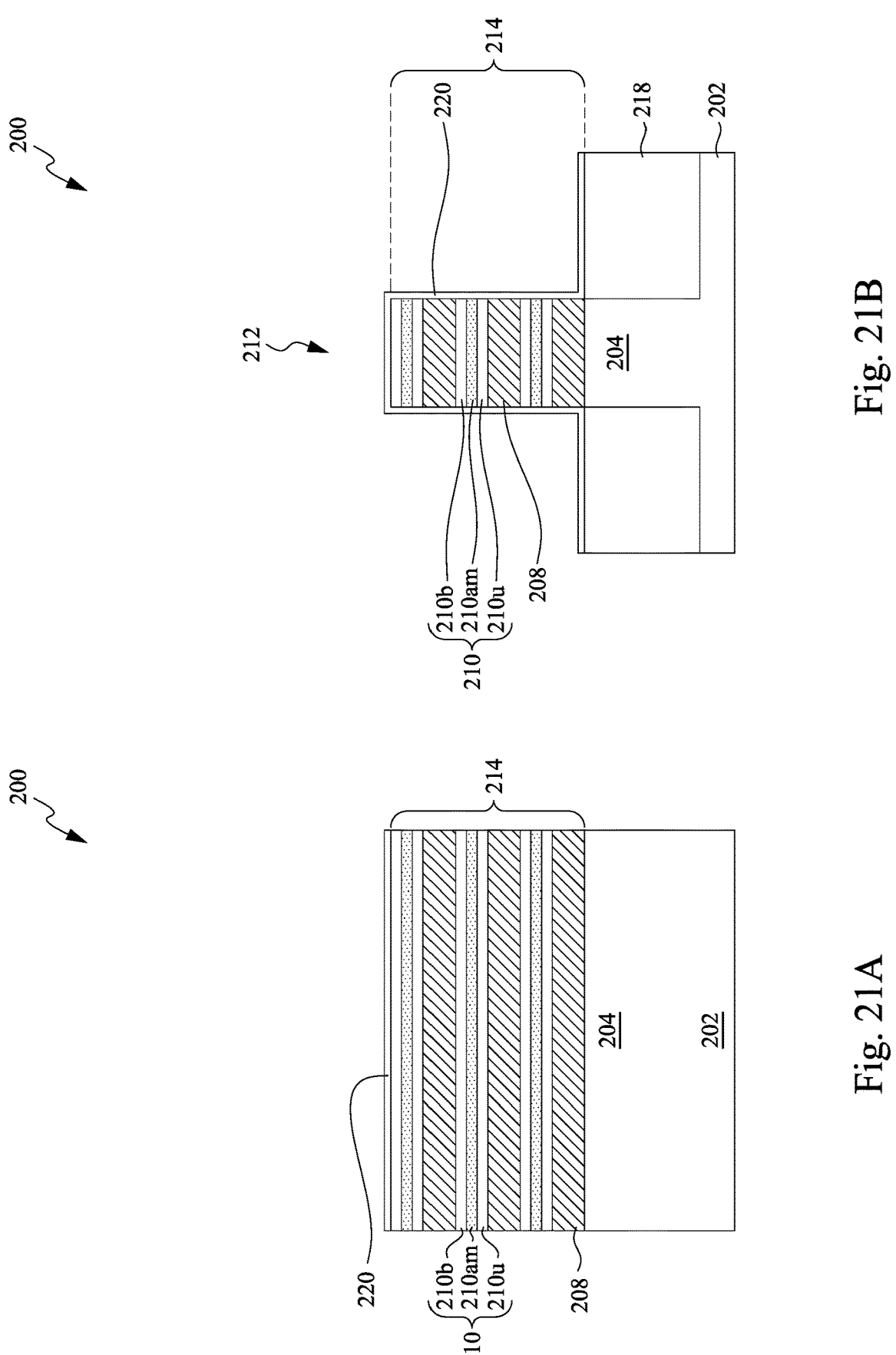
Figure 22B:
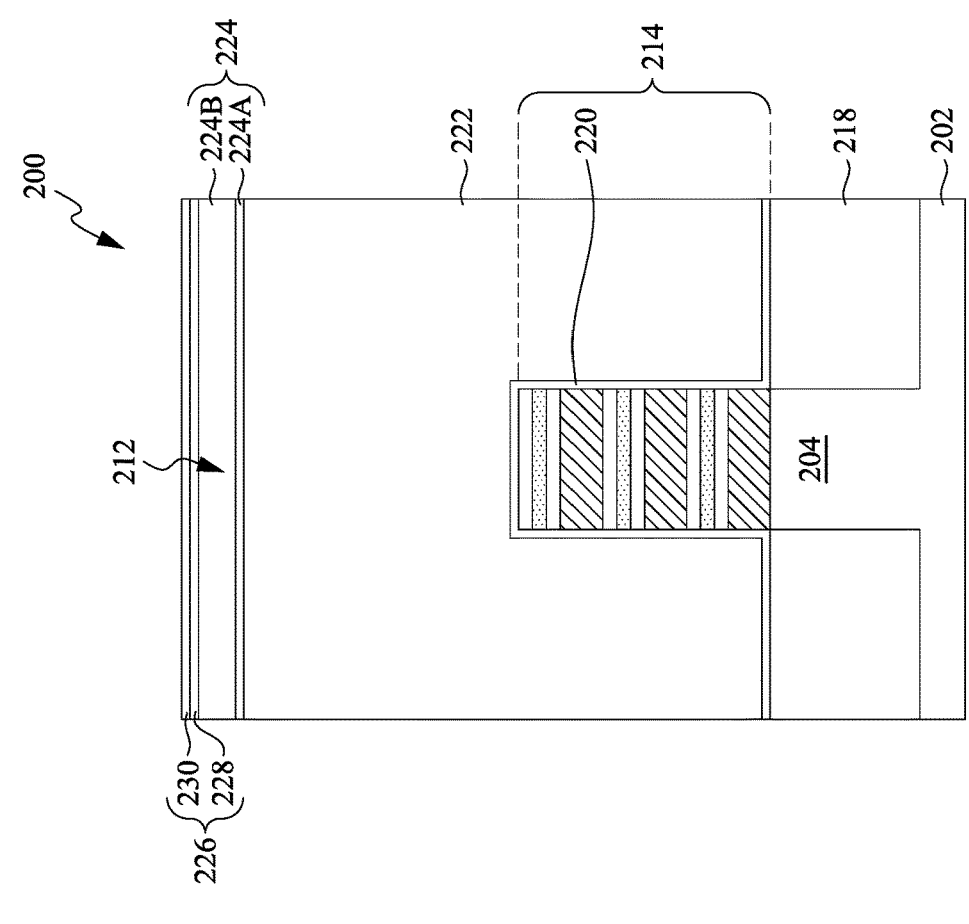
Figure 22A:
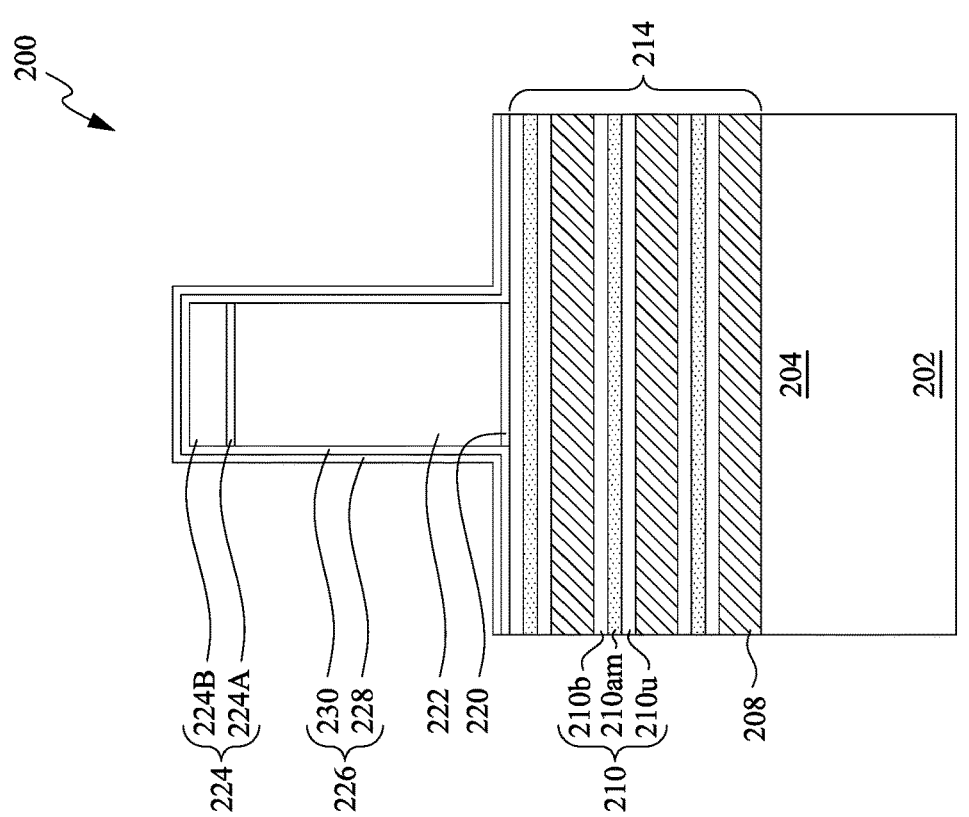

Next, in FIGS. 21A and 21B, Shallow Trench Isolation (STI) regions 218 are formed over the substrate 202 and on opposing sides of the fin structure 212. The material and the formation method of the STI regions 218 are similar to the material and the formation method of the STI region 118, and thus the description thereof is not repeated herein.

Still referring to FIGS. 21A and 21B, a dummy gate dielectric 220 is formed over the nanostructure 214 and over the STI regions 218. Next, in FIGS. 22A and 22B, a dummy gate 222 is formed over the fin 204 and over the nanostructure 214. The materials and the formation methods of the dummy gate dielectric 220 and the dummy gate 222 are similar to the materials and the formation methods of the dummy gate dielectric 120 and the dummy gate 122 with regard to FIGS. 4A-5B, and thus the description thereof is not repeated herein.

Masks 224 are then formed over the dummy gate layer. The masks 224 may be formed from silicon nitride, silicon oxynitride, combinations thereof, or the like, and may be patterned using acceptable photolithography and etching techniques. In the illustrated embodiment, the mask 224 includes a first mask layer 224A (e.g., a silicon oxide layer) and a second mask layer 224B (e.g., a silicon nitride layer). The pattern of the masks 224 is then transferred to the dummy gate layer by an acceptable etching technique to form the dummy gate 222, and then transferred to the dummy dielectric layer by acceptable etching technique to form dummy gate dielectrics 220. The dummy gate 222 cover respective channel regions of the nanostructures 214. The pattern of the masks 224 may be used to physically separate the dummy gate 222 from adjacent dummy gates 222. The dummy gate 222 may also have a lengthwise direction substantially perpendicular to the lengthwise direction of the fins 204. The dummy gate 222 and the dummy gate dielectric 220 are collectively referred to as dummy gate structure, in some embodiments.

Next, a gate spacer layer 226 is formed by conformally depositing an insulating material over the nanostructure 214, the STI regions 218, and the dummy gate 222. The insulating material may be silicon nitride, silicon carbonitride, a combination thereof, or the like. In some embodiments, the gate spacer layer 226 includes multiple sublayers. For example, a first sublayer 228 (sometimes referred to as a gate seal spacer layer) may be formed by thermal oxidation or a deposition, and a second sublayer 230 (sometimes referred to as a main gate spacer layer) may be conformally deposited on the first sublayer 228.

Figure 23:
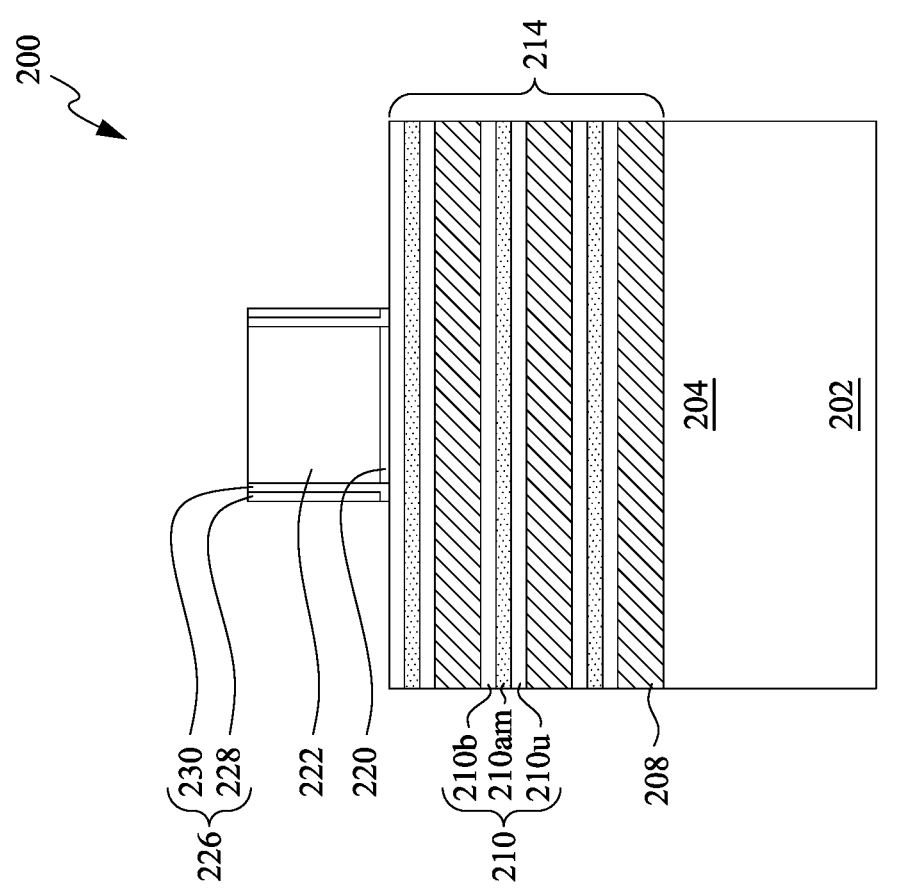

Next, in FIG. 23, the gate spacer layer 226 is etched by an anisotropic etching process to form gate spacers 226. The anisotropic etching process may remove horizontal portions of the gate spacer layer 226 (e.g., portions over the STI regions 218 and the dummy gate 222), with remaining vertical portions of the gate spacer layer 226 (e.g., along sidewalls of the dummy gate 222 and the dummy gate dielectric 220) forming the gate spacers 226.

After the formation of the gate spacers 226, implantation for lightly doped source/drain (LDD) regions (not shown) may be performed. Appropriate type (e.g., p-type or n-type) impurities may be implanted into the exposed nanostructure 214 and/or the semiconductor fin 204. The n-type impurities may be the any suitable n-type impurities, such as phosphorus, arsenic, antimony, or the like, and the p-type impurities may be the any suitable p-type impurities, such as boron, BF2, indium, or the like. An anneal process may be used to activate the implanted impurities.

Figure 24:
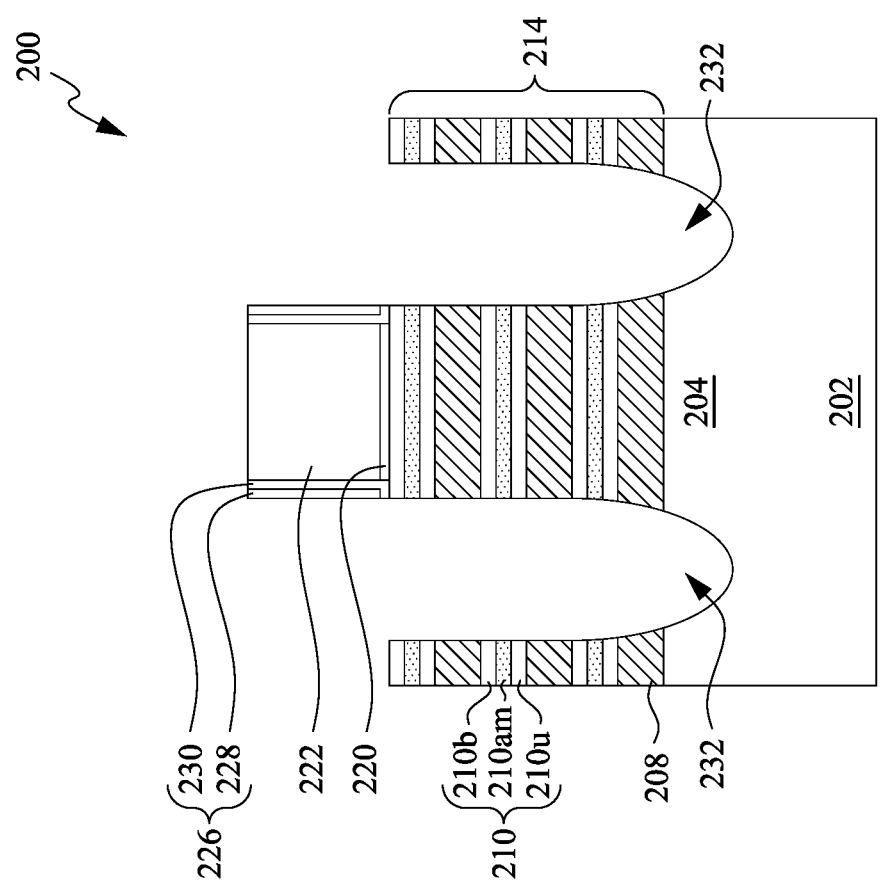

Next, in FIG. 24, openings 232 (may also be referred to as recesses) are formed in the nanostructure 214. The openings 232 may extend through the nanostructure 214 and into the semiconductor fin 204. The openings 232 may be formed by any acceptable etching technique, using, e.g., the dummy gate 222 as an etching mask. The openings 232 exposes end portions of the semiconductor material 208 and end portions of the silicon material 210.

Figure 25:
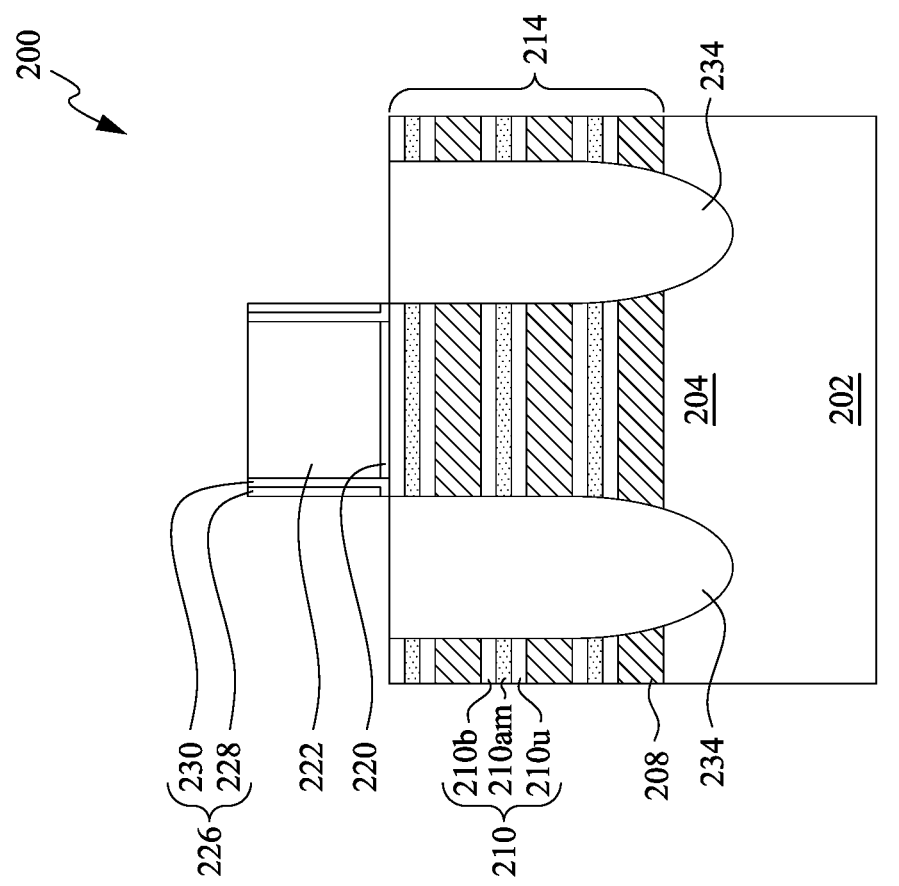

Next, in FIG. 25, source/drain regions 234 are formed in the openings 232. In some embodiments, the material and the formation method of the source/drain regions 234 similar to the material and the formation method of the source/drain regions 134 with regard to FIG. 8, and thus the description thereof is not repeated. For example, in some embodiments where the NSFET device 200 is an n-type device, the epitaxial source/drain regions 234 may include materials exerting a tensile strain in the channel regions, such as silicon, SiC, SiCP, SiP, or the like.

Figures 26A, 26B:
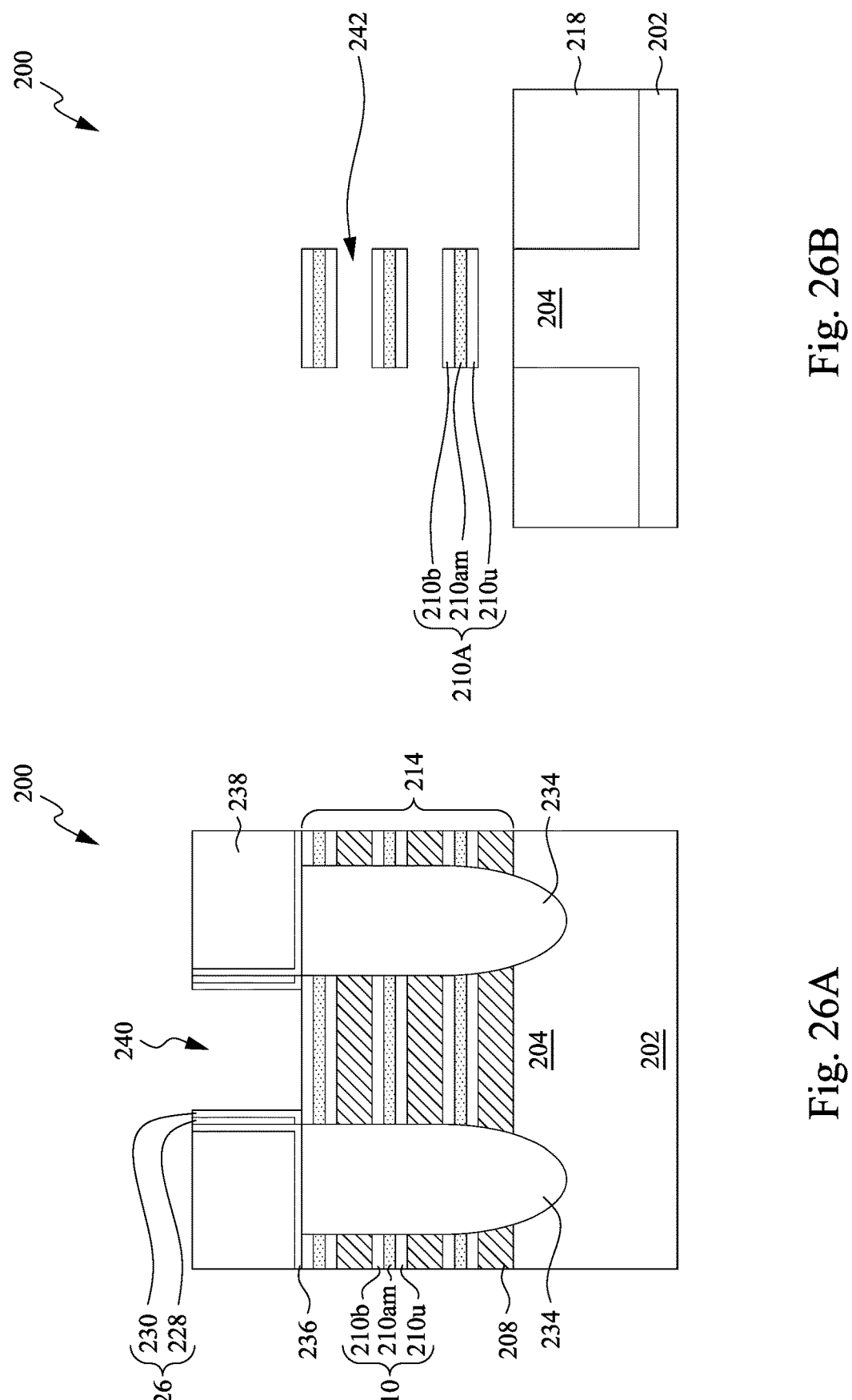

Next, in FIGS. 26A-26B, a contact etch stop layer (CESL) 236 is formed (e.g., conformally) over the source/drain regions 234 and over the dummy gate 222, and a first inter-layer dielectric (ILD) 238 is then deposited over the CESL 236. The materials and the formation methods of the CESL 236 and the first ILD 238 may be similar to the materials and the formation methods of the CESL 136 and the ILD 138, and thus the description thereof is omitted herein.

Next, the dummy gate 222 is removed. To remove the dummy gate 222, a planarization process, such as a CMP, may be performed to level the top surfaces of the first ILD 238 and CESL 236 with the top surfaces of the dummy gate 222 and the gate spacers 226. The planarization process may also remove the masks 224 (see FIG. 22A) on the dummy gates 222 (if the mask 224 has not been removed by the anisotropic etching process to form the gate spacers 226, and portions of the gate spacers 226 along sidewalls of the masks 224. After the planarization process, top surfaces of the dummy gate 222, gate spacers 226, the CESL 236 and first ILD 238 are level. Accordingly, the top surface of the dummy gate 222 is exposed at the upper surface of the first ILD 238.

After the planarization process, the dummy gate 222 is removed in an etching step(s), so that a recess 240 (may also be referred to as an opening 240) is formed between the gate spacers 226. In some embodiments, the dummy gate 222 is removed by an anisotropic dry etch process. For example, the etching process may include a dry etch process using reaction gas(es) that selectively etch the dummy gate 222 without etching the first ILD 238 or the gate spacers 226. The recess 240 exposes the channel regions of the NSFET device 200. The channel regions are disposed between neighboring pairs of the epitaxial source/drain regions 234. During the removal of the dummy gate 222, the dummy gate dielectric 220 may be used as an etch stop layer when the dummy gate 222 is etched. The dummy gate dielectric 220 may then be removed after the removal of the dummy gate 222. After removal of the dummy gate 222, the semiconductor material 208 and the silicon material 210 that were disposed under the dummy gate 222 are exposed by the recess 240.

Next, the semiconductor material 208 is removed to release the silicon material 210. After the semiconductor material 208 is removed, the silicon material 210 forms a plurality of nanosheets 210 that extend horizontally (e.g., parallel to a major upper surface of the substrate 202). The nanosheets 210 may be collectively referred to as the channel regions or the channel layers of the NSFET device 200 formed. As illustrated in FIGS. 26A-26B, gaps 242 (e.g., empty spaces) are formed between the nanosheets 210 by the removal of the semiconductor material 208. The nanosheets 210 may also be referred to as nanowires, and the NSFET device 200 may also be referred to as a gate-all-around (GAA) device, in some embodiments. The implanted region 210am' is in a middle of each of the nanosheets 210. Each of the nanosheets 210 has oxygen free regions (e.g., the un-implanted region 210u and the second silicon sub-layer 210b) on opposite sides of the oxygen-doped region (e.g., the implanted region 210am').

In some embodiments, the semiconductor material 208 is removed by a selective etching process using an etchant that is selective to (e.g., having a higher etch rate for) the semiconductor material 208, such that the semiconductor material 208 is removed without substantially attacking the silicon material 210. In an embodiment, an isotropic etching process is performed to remove the semiconductor material 208. The isotropic etching process may be performed using an etching gas, and optionally, a carrier gas. In some embodiments where the semiconductor material 208 includes silicon germanium, the etching gas comprises HF, a mixture of $F_2$ and HF, or the like, and the carrier gas may be an inert gas such as Ar, He, $N_2$, combinations thereof, or the like. In some embodiments, an etchant such as dissolved ozone in de-ionized water (DIG) is used to selectively remove the semiconductor material 208.

Figures 27A, 27B:
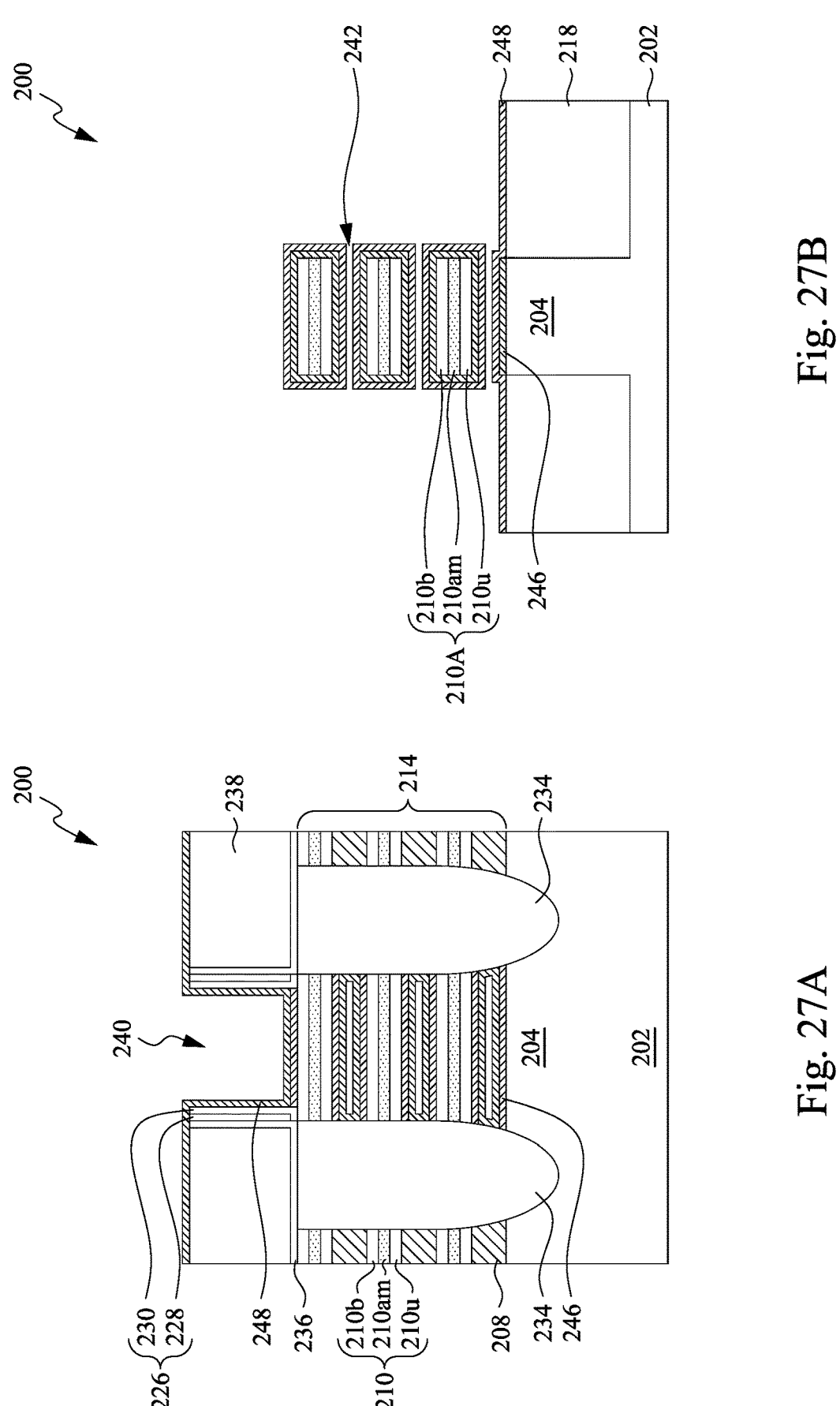

Next, in FIGS. 27A-27B, an interfacial layer 246 is formed (e.g., conformally) in the recess 240 and in the gaps 242. The interfacial layer 246 wraps around the nanosheets 210 and extends along the upper surface of the fin 204. The interfacial layer 246 may include a dielectric material such as silicon oxide ($SiO_2$) or silicon oxynitride (SiON). The interfacial layer may be formed by chemical oxidation, thermal oxidation, atomic layer deposition (ALD), chemical vapor deposition (CVD), and/or other suitable method.

A gate dielectric layer 248 is then formed (e.g., conformally) in the recess 240 and in the gaps 242. The gate dielectric layer 248 wraps around the nanosheets 210, lines sidewalls of the gate spacers 226, and extends along the upper surface of the fin 204. In accordance with some embodiments, the material and the formation method of the gate dielectric layer 248 may be similar to the material and the formation method of the gate dielectric layer 148 with regard to FIGS. 12A-12B, and thus the description thereof is not repeated herein.

Figures 28A, 28B:
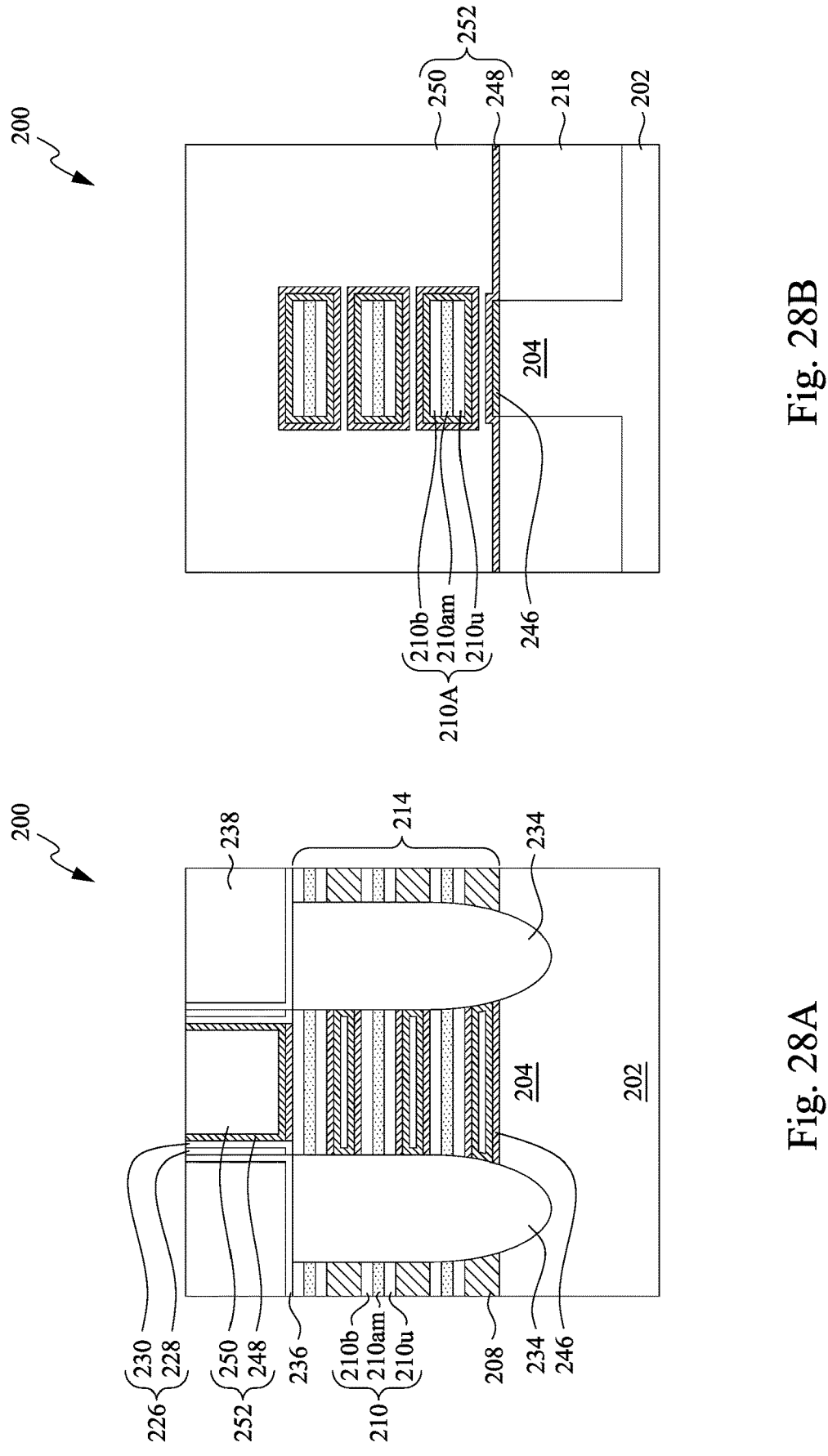
Figure 29:
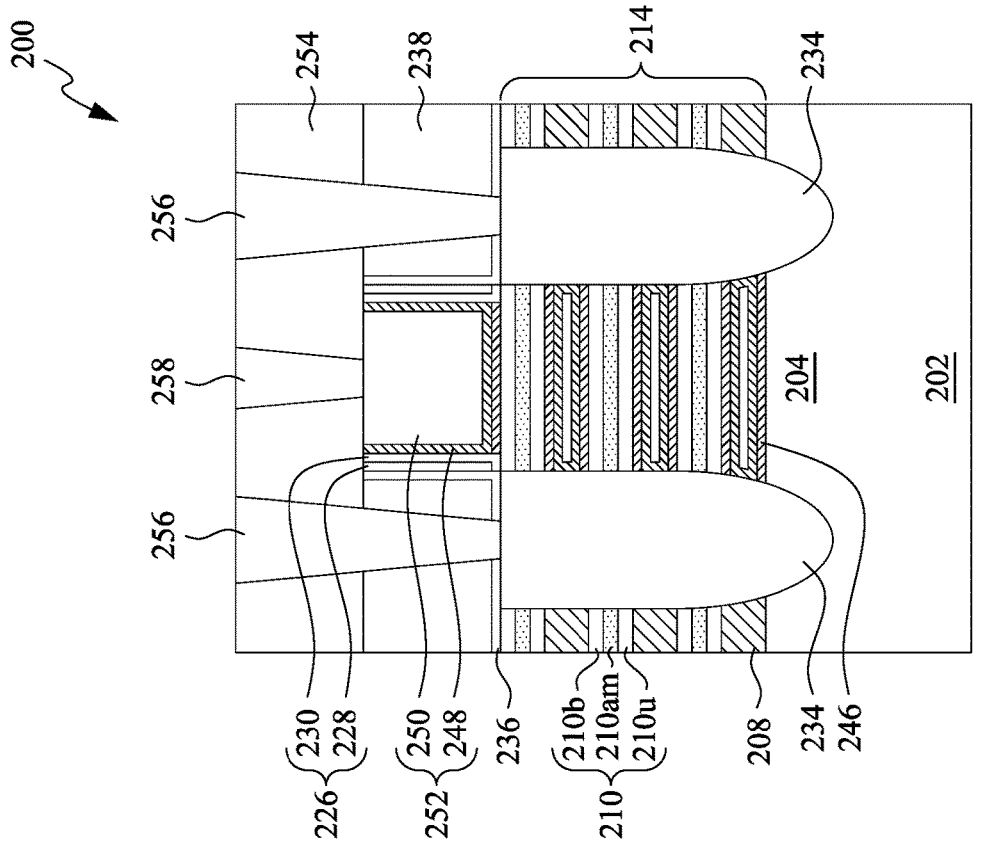

Reference is made to FIGS. 28A-28B. Next, a gate electrode material (e.g., an electrically conductive material) is formed in the recess 240 and the gaps 242 to form the gate electrode 250. The gate electrode 250 fills the remaining portions of the recess 240 and the gaps 242. The gate electrode 250 may be made of a metal-containing material such as Cu, Al, W, the like, combinations thereof, or multi-layers thereof, and may be formed by, e.g., electroplating, electroless plating, or other suitable method. After the filling of the gate electrodes 250, a planarization process, such as a CMP, may be performed to remove the excess portions of the gate dielectric layer 248 and the material of the gate electrodes 250, which excess portions are over the top surface of the first ILD 238. The remaining portions of material of the gate electrode 250 and the gate dielectric layer 248 thus form replacement gate of the resulting NSFET device 200. The gate electrode 250 and the corresponding gate dielectric layer 248 may be collectively referred to as a gate stack 252, a replacement gate structure 252, or a metal gate structure 252. Each gate stack 252 extends over and around the respective nanosheets 210.

Although the gate electrode 250 is illustrated as a single layer in the example of FIGS. 28A-28B, one skilled in the art will readily appreciate that the gate electrode 250 may have a multi-layered structure and may include a plurality layers, such as a barrier layer, a work function layer, a seed layer and a fill metal, which is similar to the material of the gate electrode 150 with regard to FIGS. 13A-13B, and thus the description thereof is not repeated herein.

Additional processing may be performed to finish fabrication of the NSFET device 200, as one of ordinary skill readily appreciates, thus details may not be repeated here. For example, referring to FIG. 29, a second ILD 254 may be deposited over the first ILD 238. Further, a gate contact 258 and source/drain contacts 256 may be formed extending through the second ILD 254 and/or the first ILD 238 to electrically couple to the gate electrode 250 and the source/drain regions 234, respectively.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that incorporating oxygen into the nanosheets allows for reduction of the electron effective mass, resulting in increased carrier mobility and decreased source/drain resistance. Another advantage is that the drive current of the NSFET can be enhanced accordingly.

In some embodiments, a method of forming a semiconductor device includes forming a fin on a substrate, the fin comprising alternately stacked first semiconductor layers and second semiconductor layers, removing the first semiconductor layers to form a plurality of spaces each between adjacent two of the second semiconductor layers, implanting oxygen into the second semiconductor layers, and forming a gate structure wrapping around the second semiconductor layers. In some embodiments, after the implanting, the second semiconductor layers each have implanted regions on opposite surfaces of the second semiconductor layers. In some embodiments, the implanted regions of the second semiconductor layers have an oxygen concentration gradient. In some embodiments, the method further includes an interfacial layer wrapping around the second semiconductor layers, the interfacial layer comprises a first oxygen concentration profile, the implanted regions have a second oxygen concentration profile different from the first oxygen concentration profile. In some embodiments, the second oxygen concentration profile has a greater concentration variation than the first oxygen concentration profile. In some embodiments, implanting oxygen into the second semiconductor layers is performed using oxygen, ozone or a combination thereof.

In some embodiments, a method of forming a semiconductor device includes forming a multi-layer stack on a substrate, wherein the multi-layer stack comprises alternately stacked first semiconductor layers and second semiconductor layers, wherein each of the second semiconductor layers comprises a first sub-layer having an oxygen-doped region, and a second sub-layer over the first sub-layer, wherein the second sub-layer is oxygen-free, removing the first semiconductor layers to form a plurality of spaces each between adjacent two of the second semiconductor layers, and forming a gate wrapping around the second semiconductor layers. In some embodiments, forming the multi-layer stack comprises forming a first one of first semiconductor layers, forming a first sub-layer of a first one of the second semiconductor layers on the first one of the first semiconductor layers, and doping oxygen into the first sub-layer of the first one of the second semiconductor layers to form the oxygen-doped region. In some embodiments, doping oxygen into the first sub-layer of the first one of the second semiconductor layers is performed using oxygen, ozone or a combination thereof. In some embodiments, the method further includes annealing the first sub-layer after doping oxygen into the first sub-layer of the first one of the second semiconductor layers. In some embodiments, forming the multi-layer stack further comprises after doping oxygen into the first sub-layer of the first one of the second semiconductor layers, growing a second sub-layer of the first one of the semiconductor layers on the first sub-layer of the first one of the second semiconductor layers. In some embodiments, the oxygen in the oxygen-doped region of the first sub-layer occupies interstitial sites in a crystal lattice. In some embodiments, in each of the semiconductor layers the first sub-layer has an un-doped region, and the oxygen-doped region is sandwiched between the un-doped region and the second sub-layer. In some embodiments, the un-doped region of the first sub-layer and the second sub-layer are exposed by removing the first semiconductor layers, and then covered with the gate.

In some embodiments, a semiconductor device includes semiconductor channels extending in a first direction above a substrate and spaced apart in a second direction perpendicular to the substrate, wherein each of the semiconductor channels has an oxygen-doped region, a gate wrapping around the semiconductor channels, and source/drain regions on opposite sides of the gate. In some embodiments, the oxygen-doped region is in a middle region of the each of the semiconductor channels. In some embodiments, each of the semiconductor channels has oxygen-free regions on opposite sides of the oxygen-doped region. In some embodiments, the oxygen in the oxygen-doped region has a non-uniform oxygen concentration profile. In some embodiments, the oxygen in the oxygen-doped region occupies interstitial sites in a crystal lattice. In some embodiments, the semiconductor device further includes a silicon oxide layer wrapping around the semiconductor channels, wherein the silicon oxide layer has an oxygen concentration profile different from an oxygen concentration profile of the oxygen-doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a fin on a substrate, the fin comprising alternately stacked first semiconductor layers and second semiconductor layers;
    removing the first semiconductor layers to form a plurality of spaces each between adjacent two of the second semiconductor layers;
    implanting oxygen into the second semiconductor layers, wherein after the implanting, at least one of the second semiconductor layers has implanted regions on opposite surfaces of the second semiconductor layers;
    forming an interfacial layer wrapping around the second semiconductor layers, wherein the interfacial layer comprises a first oxygen concentration profile, the implanted regions have a second oxygen concentration profile different from the first oxygen concentration profile; and
    forming a gate structure wrapping around the second semiconductor layers.

2. The method of claim 1, wherein the implanted regions of the at least one of the second semiconductor layers have an oxygen concentration gradient.

3. The method of claim 1, wherein the second oxygen concentration profile has a greater concentration variation than the first oxygen concentration profile.

4. The method of claim 1, wherein implanting oxygen into the second semiconductor layers is performed using oxygen, ozone or a combination thereof.

5. A method of forming a semiconductor device, comprising:
    forming a multi-layer stack on a substrate, wherein the multi-layer stack comprises alternately stacked first semiconductor layers and second semiconductor layers, wherein each of the second semiconductor layers comprises:
    a first sub-layer having an oxygen-doped region; and
    a second sub-layer over the first sub-layer, wherein the second sub-layer is oxygen-free;
    removing the first semiconductor layers to form a plurality of spaces each between adjacent two of the second semiconductor layers;
    wherein forming the multi-layer stack comprises forming a first one of first semiconductor layers;
        forming a first sub-layer of a first one of the second semiconductor layers on the first one of the first semiconductor layers; and
        doping oxygen into the first sub-layer of the first one of the second semiconductor layers to form the oxygen-doped region; and
    forming a gate wrapping around the second semiconductor layers.

6. The method of claim 5, wherein doping oxygen into the first sub-layer of the first one of the second semiconductor layers is performed using oxygen, ozone or a combination thereof.

7. The method of claim 5, further comprising:
    annealing the first sub-layer after doping oxygen into the first sub-layer of the first one of the second semiconductor layers.

8. The method of claim 5, wherein forming the multi-layer stack further comprises:
    after doping oxygen into the first sub-layer of the first one of the second semiconductor layers, growing a second sub-layer of the first one of the semiconductor layers on the first sub-layer of the first one of the second semiconductor layers.

9. The method of claim 5, wherein the oxygen in the oxygen-doped region of the first sub-layer occupies interstitial sites in a crystal lattice.

10. The method of claim 5, wherein in each of the semiconductor layers the first sub-layer has an un-doped region, and the oxygen-doped region is sandwiched between the un-doped region and the second sub-layer.

11. The method of claim 10, wherein the un-doped region of the first sub-layer and the second sub-layer are exposed by removing the first semiconductor layers, and then covered with the gate.

12. A method of forming a semiconductor device, comprising:
    forming semiconductor channels extending in a first direction above a substrate and spaced apart in a second direction perpendicular to the substrate, wherein each of the semiconductor channels has an oxygen-doped region, the oxygen-doped region is in a middle region of at least one of the semiconductor channels;
    forming a gate wrapping around the semiconductor channels; and
    forming source/drain regions on opposite sides of the gate.

13. The method of claim 12, wherein each of the semiconductor channels has oxygen-free regions on opposite sides of the oxygen-doped region.

14. The method of claim 12, wherein the oxygen in the oxygen-doped region has a non-uniform oxygen concentration profile.

15. The method of claim 12, wherein the oxygen in the oxygen-doped region occupies interstitial sites in a crystal lattice.

16. The method of claim 12, further comprising:

forming a silicon oxide layer wrapping around the semiconductor channels, wherein the silicon oxide layer has an oxygen concentration profile different from an oxygen concentration profile of the oxygen-doped region.

17. The method of claim 1, wherein the second oxygen concentration profile of the implanted regions has a peak concentration at a depth in one of the second semiconductor layers.

18. The method of claim 1, wherein implanting the oxygen into the second semiconductor layers is performed using ozone.

19. The method of claim 1, wherein the interfacial layer is a silicon oxide-containing layer.

20. The method of claim 12, further comprising:

after forming the semiconductor channels, forming an interfacial layer wrapping around the semiconductor channels.

* * * * *